(12) United States Patent
Nakabayashi et al.

(10) Patent No.: US 10,707,384 B2
(45) Date of Patent: Jul. 7, 2020

(54) LIGHT-EMITTING DEVICE

(71) Applicant: NICHIA CORPORATION, Anan-shi, Tokushima (JP)

(72) Inventors: Takuya Nakabayashi, Tokushima (JP); Tadaaki Ikeda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/027,950

(22) Filed: Jul. 5, 2018

(65) Prior Publication Data

US 2019/0013443 A1 Jan. 10, 2019

(30) Foreign Application Priority Data

Jul. 6, 2017 (JP) .................................. 2017-132660
Aug. 31, 2017 (JP) .................................. 2017-166354
May 23, 2018 (JP) .................................. 2018-099124

(51) Int. Cl.
*H01L 33/48* (2010.01)
*H01L 33/62* (2010.01)
*H01L 33/60* (2010.01)
*H01L 33/44* (2010.01)
(Continued)

(52) U.S. Cl.
CPC ............ *H01L 33/486* (2013.01); *H01L 33/44* (2013.01); *H01L 33/60* (2013.01); *H01L 33/62* (2013.01); *H01L 25/0753* (2013.01); *H01L 33/50* (2013.01); *H01L 33/507* (2013.01)

(58) Field of Classification Search
None
See application file for complete search history.

(56) References Cited

U.S. PATENT DOCUMENTS 6,392,294 B1 5/2002 Yamaguchi
2009/0146176 A1 6/2009 Oishi
(Continued)

FOREIGN PATENT DOCUMENTS

JP 2000188358 A 7/2000
JP 2002335020 A 11/2002
(Continued)

*Primary Examiner* — Reema Patel
*Assistant Examiner* — Steven M Christopher
(74) *Attorney, Agent, or Firm* — Hunton Andrews Kurth LLP

(57) ABSTRACT

A light-emitting device includes a substrate including a base member having an upper surface having a substantially rectangular shape, a lower surface opposite to the upper surface, a first longer lateral surface, a second longer lateral surface opposite to the first longer lateral surface, a first shorter lateral surface, and a second shorter lateral surface opposite to the first shorter lateral surface, first wirings disposed on the upper surface, and second wirings disposed on the lower surface and each electrically connected with a respective one of the first wirings; at least one light-emitting element; and a light-reflective covering member covering lateral surfaces of the light-emitting element and the upper surface of the base member. The base member has at least one first recess open at the upper surface and the first longer lateral surface. Surfaces defining the at least one first recess are covered with the covering member.

20 Claims, 27 Drawing Sheets

(51) Int. Cl.
    *H01L 33/50*     (2010.01)
    *H01L 25/075*     (2006.01)

(56) References Cited

U.S. PATENT DOCUMENTS

| | | | |
|---|---|---|---|
| 2010/0022040 A1* | 1/2010 | Konishi | B29C 45/14655 438/29 |
| 2013/0049061 A1 | 2/2013 | Takeda et al. | |
| 2015/0021642 A1 | 1/2015 | Nakabayashi | |

FOREIGN PATENT DOCUMENTS

| | | |
|---|---|---|
| JP | 2009146935 A | 7/2009 |
| JP | 2010027974 A | 2/2010 |
| JP | 2013045888 A | 3/2013 |
| JP | 2013120821 A | 6/2013 |
| JP | 2014072213 A | 4/2014 |
| JP | 2015-038963 A | 2/2015 |
| JP | 2015023162 A | 2/2015 |

\* cited by examiner

LIGHT-EMITTING DEVICE

CROSS-REFERENCE TO RELATED APPLICATION

This application claims priority to Japanese Patent Application No. 2017-132660, filed on Jul. 6, 2017, Japanese Patent Application No. 2017-166354, filed on Aug. 31, 2017 and Japanese Patent Application No. 2018-099124, filed on May 23, 2018, the disclosures of which are hereby incorporated by reference in their entireties.

BACKGROUND

The present disclosure relates to a light-emitting device.

For example, Japanese Laid-Open Patent Publication No. 2014-072213 describes a light-emitting device including a substrate, an LED chip mounted on the substrate, a phosphor layer above the LED chip, and a dam member (i.e., covering member) surrounding the LED chip.

SUMMARY

It is an object of the present invention to provide a light-emitting device having an increased joining strength between a substrate and a covering member.

In one embodiment of the present invention, a light-emitting device includes a substrate including a base member having an upper surface having a substantially rectangular shape, a lower surface opposite to the upper surface, a first longer lateral surface adjacent to a longer side of the upper surface and perpendicular to the upper surface, a second longer lateral surface opposite to the first longer lateral surface, a first shorter lateral surface adjacent to a shorter side of the upper surface and perpendicular to the upper surface, and a second shorter lateral surface opposite to the first shorter lateral surface, first wirings disposed on the upper surface, and second wirings disposed on the lower surface and each electrically connected with a respective one of the first wirings; at least one light-emitting element electrically connected with the first wirings and disposed on the first wirings; and a light-reflective covering member covering lateral surfaces of the light-emitting element and the upper surface of the base member.

The base member has at least one first recess, the at least one first recess being open at the upper surface and the first longer lateral surface. Surfaces defining the at least one first recess are covered with the covering member.

In another embodiment of the present invention, a light-emitting device includes a substrate including a base member having a upper surface having a substantially rectangular shape, a lower surface opposite to the upper surface, a first longer lateral surface adjacent to a longer side of the upper surface and perpendicular to the upper surface, a second longer lateral surface opposite to the first longer lateral surface, a first shorter lateral surface adjacent to a shorter side of the upper surface and perpendicular to the upper surface, and a second shorter lateral surface opposite to the first shorter lateral surface, first wirings disposed on the upper surface, and second wirings disposed on the lower surface and each electrically connected with a respective one of the first wirings; at least one light-emitting element electrically connected with the first wirings and disposed on the first wirings; and a light-reflective covering member covering lateral surfaces of the light-emitting element and the upper surface of the base member. The base member has a second recess, the second recess open at the upper surface and the first shorter lateral surface. Surfaces defining the second recess are covered with the covering member.

In further another embodiment of the present invention, a light-emitting device includes a substrate including a base member having an upper surface having a substantially rectangular shape, a lower surface opposite to the upper surface, and lateral surfaces located between the upper surface and the lower surface, first wirings disposed on the upper surface, and second wirings located on the lower surface and each electrically connected with a respective one of the first wirings, at least one light-emitting element electrically connected with the first wirings and disposed on the first wirings; and a light-reflective covering member covering lateral surfaces of the light-emitting element and the upper surface of the base member. The lateral surfaces of the base member includes a first longer lateral surface adjacent to a longer side of the upper surface and perpendicular to the upper surface, a second longer lateral surface opposite to the first longer lateral surface, a first shorter lateral surface adjacent to a shorter side of the upper surface and perpendicular to the upper surface, and a second shorter lateral surface opposite to the first shorter lateral surface. The base member has a plurality of through-holes, the plurality of through-holes spaced apart from the lateral surface and extending from the upper surface to the lower surface. Surface defining each of the plurality of through-holes is covered with the covering member.

According to certain embodiments, it is possible to provide a light-emitting device having an increased joining strength of a substrate and a covering member.

DETAILED DESCRIPTION

Figure 1:
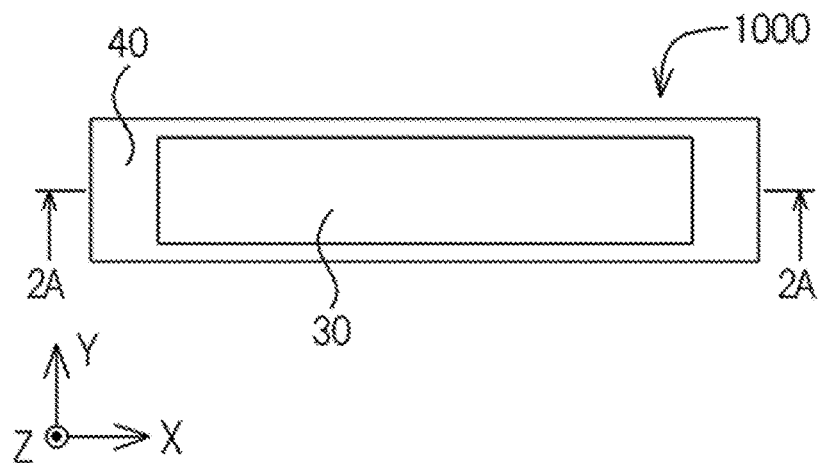
FIG. 1 is a schematic plan view of a light-emitting device according to a first embodiment of the present disclosure.

Hereinafter, with reference to the drawings when necessary, certain embodiments of the present invention will be described. Light emitting devices described below are intended to give a concrete form to the technical idea of the present invention, and the scope of the present invention is not limited to the description below unless otherwise specified. In the drawings, the size, positional relationships or the like may be exaggerated for clear explanation.

First Embodiment

A light-emitting device 1000 according to a first embodiment of the present invention will be described with reference to FIG. 1 through FIG. 13B. The light-emitting device 1000 includes a substrate 10, at least one light-emitting element 20, and a covering member 40. The substrate 10 includes a base member 11, first wirings 12, and second wirings 13. The base member 11 has a substantially rectangular upper surface 111, a lower surface 112 facing the upper surface 111, a first longer lateral surface 113 adjacent to a longer side 101 of the upper surface 111 and perpendicular to the upper surface 111, a second longer lateral surface 114 opposite to the first longer lateral surface 113, a first shorter lateral surface 115 adjacent to a shorter side 102 of the upper surface 111 and perpendicular to the upper surface 111, and a second shorter lateral surface 116 opposite to the first shorter lateral surface 115. Further, the base member 11 has at least one first recess 111R, and the at least one first recess 111R is open in the upper surface 111 and the first longer lateral surface 113. The first wirings 12 are disposed on the upper surface 111 of the base member 11. The second wirings 13 are disposed on the lower surface 112 of the base member 11, and is electrically connected with the first wirings 12. At least one light-emitting element 20 is electrically connected with the first wirings 12, and is disposed on the first wirings 12. The covering member 40 is light-reflective, and covers lateral surfaces 202 of the light-emitting element 20 and the upper surface 111 of the base member 11. The covering member 40 also covers surfaces defining the first recess 111R. In this specification, the term "perpendicular" refers to an angle in a range of 90±5°.

With the covering member 40 covering the surfaces defining the first recess 111R, the contact surface area between the base member 11 and the covering member 40 can be increased. This allows for increasing the joining strength between the base member 11 and the covering member 40. Further, with the first recess 111R that is open in the first longer lateral surface 113, the joining strength between, especially, the base member 11 and the covering member 40 can be increased at a first longer lateral surface 113 side. Accordingly, even if an external force is applied to the covering member 40 from the first longer lateral surface 113 side, detachment between the base member 11 and the covering member 40 can be prevented due to the increase in joining strength between a portion of the base member 11 and a portion of the covering member 40 at the first longer lateral surface 113 side. The first recess 111R may be open in the lower surface 112 or may be spaced apart from the lower surface 112. The first recess 111R may have any appropriate shape in a cross-sectional view. The first recess 111R may have, for example, a substantially quadrangular shape, a substantially V-shape, or the like in a cross-sectional view.

One first recess 111R may be provided. It is preferable that a plurality of the first recesses 111R are provided. With the plurality of first recesses 111R, the contact area between the base member 11 and the covering member 40 can be further increased, which allows for increasing joining strength between the base member 11 and the covering member 40. In the case where the plurality of first recesses 111R are provided, it is preferable that the light-emitting element 20 is disposed between the plurality of first recesses 111R in a top view. With such a structure, the joining strength between the base member 11 and the covering member 40 is easily increased in a wide region of the upper surface 111 of the base member 11.

It is preferable that the covering member 40 has a coefficient of linear thermal expansion that is higher than a coefficient of linear thermal expansion of the base member 11. With such an arrangement, when heat is generated upon driving the light-emitting device 1000, the covering member 40 can be prevented from being detached from the first recess 111R because the coefficient of linear thermal expansion of the covering member 40 covering the first recess 111R is higher than that of the base member 11. With the coefficient of linear thermal expansion of the covering member 40 that is higher than that of the base member 11, the covering member 40 can be prevented from being detached from a second recess, a third recess and/or through-holes, which will be described below.

Figure 2:
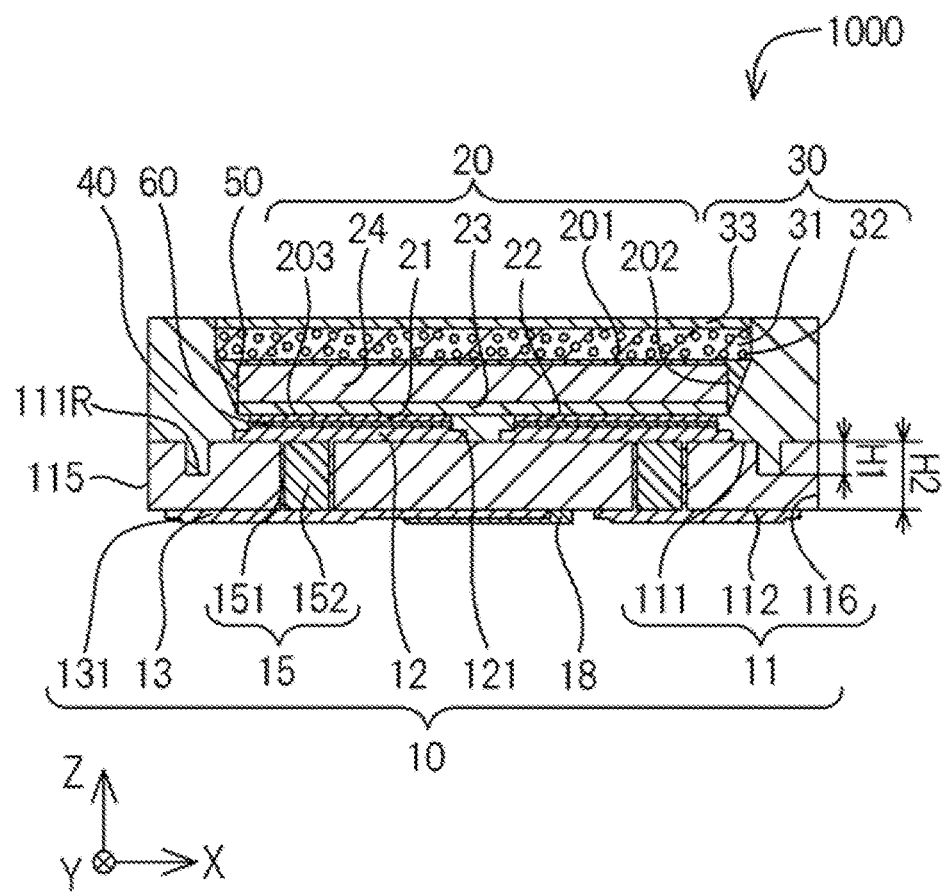
FIG. 2 is a schematic cross-sectional view taken along a line 2A-2A in FIG. 1.

As shown in FIG. 2, it is preferable that the covering member 40 is in contact with the light-emitting element 20 and is disposed between the light-emitting element 20 and the substrate 10. With the covering member 40 held between the light-emitting element 20 and the substrate 10, detachment between the base member 11 and the covering member 40 can be prevented.

As shown in FIG. 2, the light-emitting element 20 includes a semiconductor stack body 23, which includes positive and negative electrodes 21 and 22. It is preferable that the positive and negative electrodes 21 and 22 are disposed on the same surface of the light-emitting element 20 and that the light-emitting element 20 is flip-chip-mounted on the substrate 10. With such a structure, wires for supplying electric power to the positive and negative electrodes 21 and 22 of the light-emitting element 20 can be omitted, which allows reduction in size of the light-emitting device 1000. In this embodiment, the light-emitting element 20 includes an element substrate 24, but the element substrate 24 may be omitted. In the case where the light-emitting element 20 is flip-chip-mounted on the substrate 10, each of the positive and negative electrodes 21 and 22 of the light-emitting element 20 are connected with a respective one of the first wirings 12 via a conductive adhesive member 60.

The light-emitting device 1000 may include a light-transmissive member 30. It is preferable that the light-transmissive member 30 is disposed on the light-emitting element 20. With the light-transmissive member 30 disposed on the light-emitting element 20, the light-transmissive member 30 can protect the light-emitting element 20 against an external stress. It is preferable that the covering member 40 covers lateral surfaces of the light-transmissive member 30. With such a structure, the light-emitting device 1000 can have a high contrast between a light emitting region and a non-light emitting region, that is, a high visibility.

The light-emitting element 20 has a mounting surface 203 facing the substrate 10 and a light extracting surface 201 facing the mounting surface 203. As shown in FIG. 2, in the case where the light-emitting element 20 is flip-chip-mounted, the surface of the light-emitting element 20 on which the positive and negative electrodes 21 and 22 are located is referred to as the mounting surface 203, and the surface opposite thereto is referred to as the light extracting surface 201. The light-transmissive member 30 may be bonded with the light-emitting element 20 via a light guide member 50. The light guide member 50 may be disposed only between the light extracting surface 201 of the light-emitting element 20 and the light-transmissive member 30 to bond the light-emitting element 20 and the cover member 40 to each other, or may cover the light extracting surface 201 and the lateral surfaces 202 of the light-emitting element 20 to bond the light-emitting element 20 and the cover member 40 to each other. The light guide member 50 has a light transmittance higher than a light transmittance of the cover member 40, with respect to the light from the light-emitting element 20. Therefore, with the light guide member 50 covering the lateral surfaces 202 of the light-emitting element 20, light emitted from the lateral surface 202 of the light-emitting element 20 is easily extracted to the outside of the light-emitting device 1000 via the light guide member 50.

This allows for improving the light extraction efficiency.

The light-transmissive member 30 may contain a wavelength conversion substance 32. The wavelength conversion substance 32 is adapted to absorb at least a part of primary light emitted by the light-emitting element 20 and to emit secondary light different from the primary light. With the light-transmissive member 30 containing the wavelength conversion substance 32, mixed-color light in which a color of the primary light emitted by the light-emitting element 20 and a color of the secondary light emitted by the wavelength conversion substance 32 is mixed is output. For example, with the use of a blue LED as the light-emitting element 20 and a phosphor such as YAG or the like as the wavelength conversion substance 32, the light-emitting device 1000 can be obtained that emits white light which is a mixture of blue light emitted from the blue LED and yellow light emitted from the phosphor excited by the blue light.

The wavelength conversion substance 32 may be uniformly dispersed in a base member 31 of the light-transmissive member 30. Alternatively, the wavelength conversion substance 32 may be disposed more densely in the vicinity of the light-emitting element 20 than at an upper surface of the light-transmissive member 30. With the wavelength conversion substance 32 disposed more densely in the vicinity of the light-emitting element 20 than at the upper surface of the light-transmissive member 30, the base member 31 of the light-transmissive member 30 serves as a protective layer. Therefore, even if, the wavelength conversion substance 32 that is vulnerable against moisture is used, deterioration of the wavelength conversion substance 32 can be prevented. As shown in FIG. 2, the light-transmissive member 30 may include a layer containing the wavelength conversion substance 32 and a layer 33 containing substantially no wavelength conversion substance 32. With the light-transmissive member 30 in which the layer 33 containing substantially no wavelength conversion substance 32 is disposed on the layer containing the wavelength conversion substance 32, the layer 33 containing substantially no wavelength conversion substance 32 serves as a protective layer. Therefore, deterioration of the wavelength conversion substance 32 can be reduced. The expression "the layer 33 containing substantially no wavelength conversion substance 32" indicates that the layer 33 may contain the wavelength conversion substance 32 that is unavoidably mixed into the layer 33. It is preferable that the content of the wavelength conversion substance 32 in the layer 33 containing substantially no wavelength conversion substance 32 is 0.05% by weight or less. Examples of the wavelength conversion substance 32 vulnerable against moisture include a manganese-activated fluoride phosphor. The manganese-activated fluoride phosphor has a light emission spectrum having a relatively narrow half band width. Therefore, with the use of the manganese-activated fluoride phosphor, for example, the color reproducibility of a liquid crystal display can be improved.

As shown in FIG. 2, the base member 11 may include vias 15. Each of the vias 15 is disposed in a through-hole extending between the upper surface 111 and the lower surface 112 of the base member 11, and electrically connects a respective one of the first wirings 12 and a respective one of the second wirings 13 to each other. Each of the vias 15 includes a third wiring 151 covering a surface defining the through-hole extending through the base member 11 and a filling member 152 provided on the third wiring 151 to fill the through-hole. The filling member 152 may be conductive or insulating. It is preferable that a resin material is used for the filling member 152. In general, a resin material in a pre-curing state has a higher fluidity than that of a metal material in a pre-curing state. Therefore, even in the case where the through-hole having the surface covered with the third wiring 151 has a small diameter, the resin material is easily filled in the through-hole. Accordingly, using such a resin material for the filling member 152 allows for facilitating forming the substrate 10. Examples of a resin material easily filled in the through-hole include an epoxy resin. In the case where a resin material is used for the filling member 152, it is preferable that the resin material contains an additive in order to decreases the coefficient of linear thermal expansion. With such an arrangement, the difference between the coefficient of linear thermal expansion of the third wiring 151 and that of the filling member 152 is decreased, and therefore, formation of a gap between the third wiring 151 and the filling member 152 due to heat from the light-emitting element 20 can be prevented. Examples of the additive include silicon oxide. In the case where a metal material is used for the filling member 152, heat dissipating performance can be improved.

It is preferable that each of the first wirings 12 includes a first protrusion 121, which protrudes in a +Z direction, at a portion connected with the light-emitting element 20. The +Z direction refers to a direction extending upward in a Z direction.

A direction opposite to the +Z direction is a −Z direction. The first protrusion 121 is located above the upper surface 111 of the base member 11 in the Z direction. With the first protrusion 121, the first protrusion 121 and the rest of each of the first wirings 12 form a stepped portion. Accordingly, for example, when each of the positive and negative electrodes 21 and 22 of the light-emitting element 20 is bonded to the first protrusion 121 of a respective one of the first wirings 12 via a meltable member and the meltable member in a melted state flows from the first protrusion 121, the meltable member in the melted state tends to stay around the first protrusion 121. This allows for preventing entry of the meltable member into a region where the meltable material is not allowed to enter. Thus, shortcircuiting or the like of the light-emitting element 20 can be prevented. It is preferable that at least a part of an outer shape of each of the first protrusions 121 corresponds to that of a corresponding one of the positive and negative electrodes 21 and 22 of the light-emitting element 20 in a top view. With such an arrangement, when each of the positive and negative electrodes 21 and 22 of the light-emitting element 20 is bonded to the first protrusion 121 of a corresponding one of the first wirings 12 by a meltable member, a misalignment between the light-emitting element 20 and the first wirings 12 can be reduced due to a self-alignment effect.

It is preferred that each of the second wirings 13 includes a second protrusion 131 protruding in the −Z direction at a portion connected with a mounting substrate. The "mounting substrate" refers to a substrate on which the light-emitting device 1000 is to be mounted. The second protrusion 131 is located below the lower surface 112 of the base member 11 in the Z direction. With the second protrusion 131, the second protrusion 131 and the rest of each of the second wirings 13 form a stepped portion.

Accordingly, for example, when the second protrusion 131 of each of the second wirings 13 is bonded to an electrode of the mounting substrate by a meltable material and the meltable material in a melted state flows from the second protrusion 131, the meltable material in the melted state tends to stay around the second protrusion 131. This allows for preventing entry of the meltable material into a region where the meltable material is not allowed to enter. Thus, shortcircuiting or the like of the light-emitting device 1000 can be prevented. It is preferable that at least a part of an outer shape of the second protrusion 131 corresponds to an outer shape of the electrode of the mounting substrate in a bottom view. With such an arrangement, when the second protrusion 131 of each of the second wirings 13 and the electrode of the mounting substrate are bonded to each other via a meltable member, misalignment between the light-emitting device 1000 and the mounting substrate can be reduced due to a self-alignment effect.

It is preferable that the first protrusions 121 and/or the second protrusions 131 overlaps the vias 15 in a top view. In the case where an insulating material is used for the filling member 152 of each of the vias 15, a part of the filling member 152 that is exposed from the base member 11 is covered with a conductive material. With the first protrusions 121 and/or the second protrusions 131 overlaps the vias 15, the filling member 152, which is electrically insulating, can be covered with the first protrusion 121 and/or the second protrusion 131, which are formed of a conductive material. This allows reduction in thickness of the light-emitting device 1000 compared to the case where the conductive member covering the filling member 152 and the first protrusion 121 and/or the second protrusion 131 are formed in separate steps.

Figure 3:
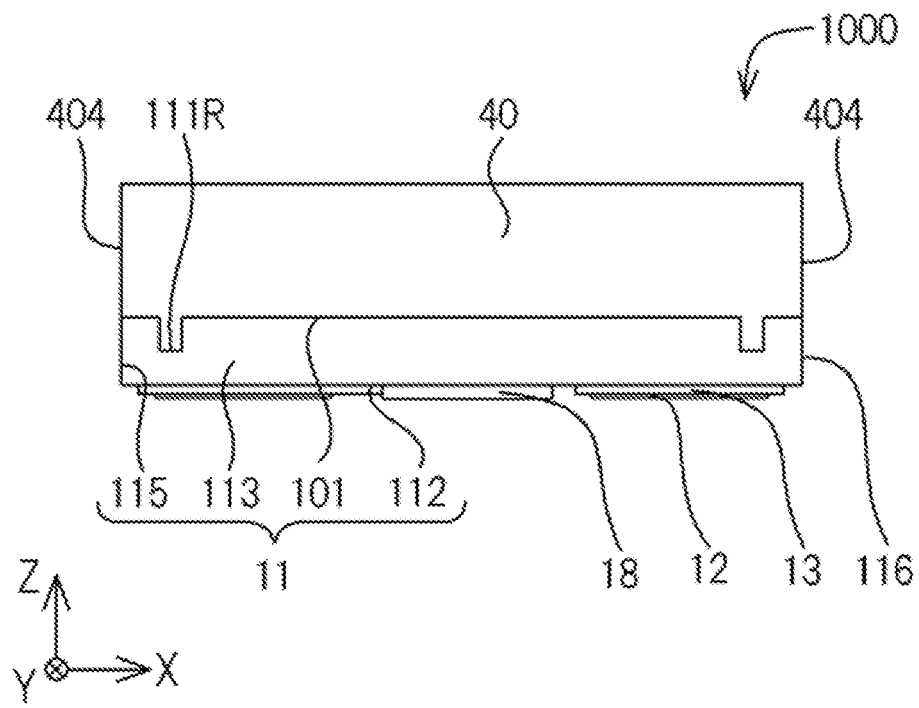
FIG. 3 is a schematic side view of the light-emitting device according to the first embodiment of the present disclosure as seen from a first longer lateral surface.

As shown in FIG. 3, it is preferable that, each of the first shorter lateral surface 115 and the second shorter lateral surface 116 of the base member 11 is in substantially the same plane as a corresponding one of the lateral surfaces 404 of the covering member 40. This allows for reducing the width of the light-emitting device 1000 in an X direction, so that the size of the light-emitting device 1000 can be reduced.

Figure 4A:
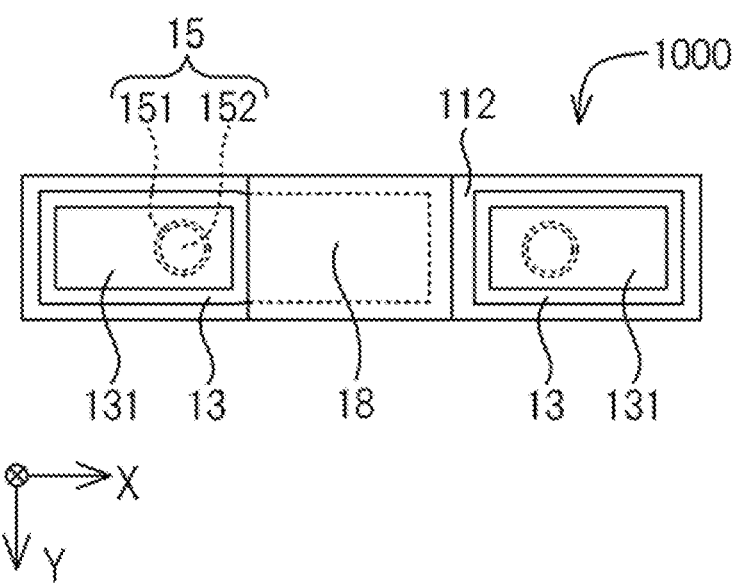
FIG. 4A is a schematic bottom view of the light-emitting device according to the first embodiment of the present disclosure.

As shown in FIG. 4A, the light-emitting device 1000 may include an insulating film 18 covering a portion of each of the second wirings 13. With the insulating film 18, electrical insulation at a lower surface of the light-emitting device 1000 can be ensured, and shortcircuiting in the light-emitting device 1000 can be prevented. Also, with the insulating film 18, the second wirings 13 can be prevented from being detached from the base member 11.

Figure 4B:
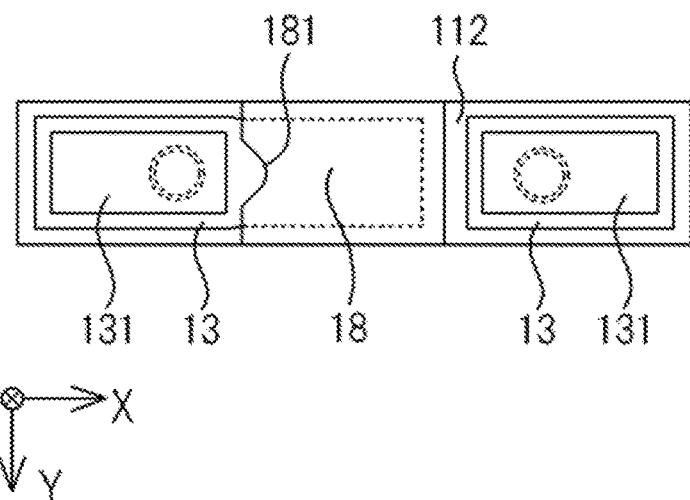
FIG. 4B is a schematic bottom view of a light-emitting device according to a modified example of the first embodiment of the present disclosure.
Figure 4C:
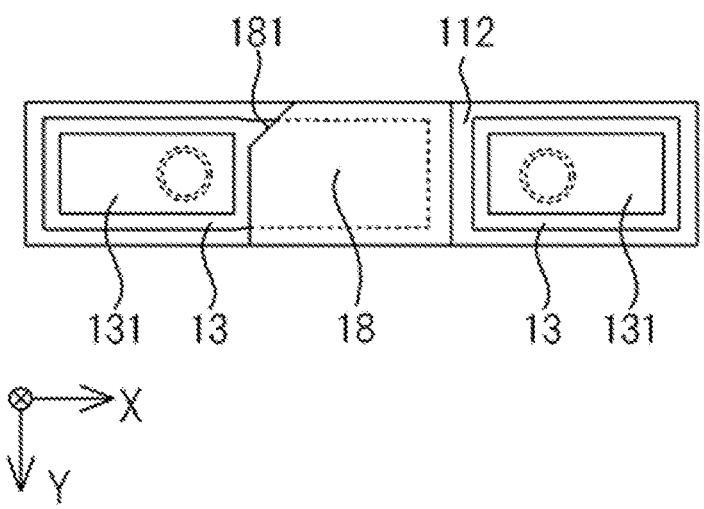
FIG. 4C is a schematic bottom view of a light-emitting device according to another modified example of the first embodiment of the present disclosure.

As shown in FIG. 4B, in a bottom view, the insulating film 18 covering a part of one of the second wirings 13 may have an insulating film recess 181 being recessed in the X direction. With the insulating film recess 181, the insulating film 18 can easily have a shape that is asymmetrical with respect to a center line thereof in the X direction of the substrate 10. With the insulating film 18 having a shape asymmetrical with respect to the center line thereof in the X direction of the substrate 10, the polarity in the light-emitting device 1000 can be recognized with reference to the insulating film recess 181. The polarity in the light-emitting device 1000 may also be recognized with reference to the shape of a part of one of the second wirings 13 that is exposed from the insulating film 18. In FIG. 4B, the insulating film recess 181 is located generally at the center of the substrate 10 in a Y direction. Alternatively, as shown in FIG. 4C, the insulating film recess 181 may be located at an end of the substrate 10 in the Y direction.

Figure 4D:
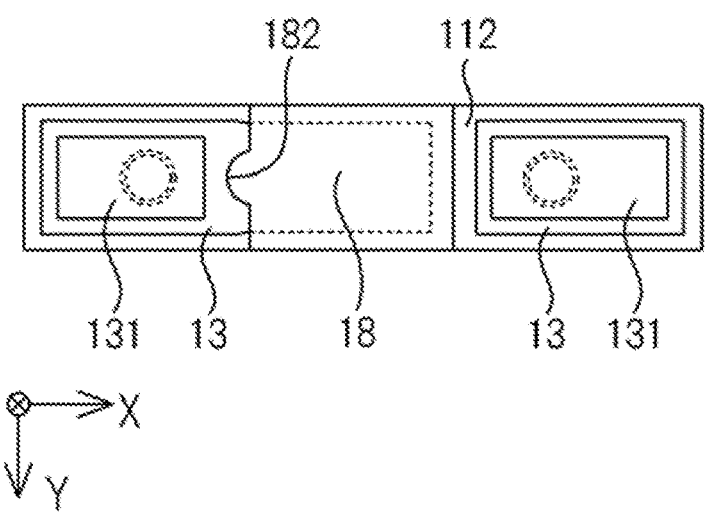
FIG. 4D is a schematic bottom view of a light-emitting device according to even another modified example of the first embodiment of the present disclosure.

As shown in FIG. 4D, in a bottom view, the insulating film 18 covering a part of one of the second wirings 13 may include an insulating film protrusion 182 extending in the X direction. With the insulating film protrusion 182, the insulating film 18 can easily have a shape asymmetrical with respect to the center line thereof in the X direction of the substrate 10. With the insulating film 18 having a shape asymmetrical with respect to the center line of the substrate 10 in the X direction, the polarity in the light-emitting device 1000 can be recognized with reference to the insulating film protrusion 182.

Figure 4E:
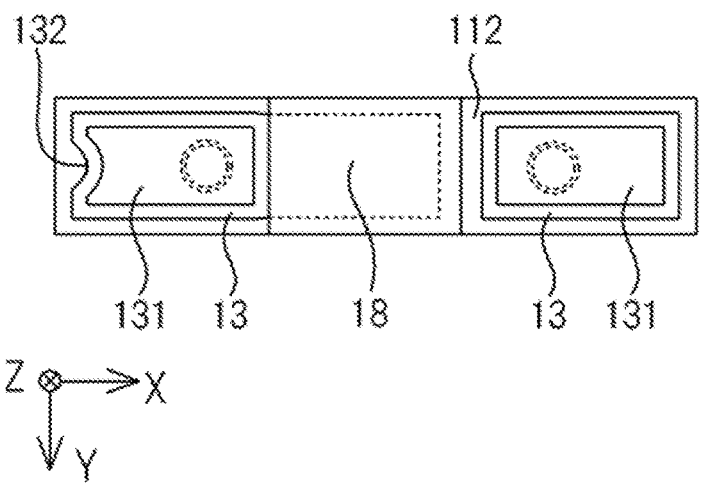
FIG. 4E is a schematic bottom view of a light-emitting device according to yet another modified example of the first embodiment of the present disclosure.
Figure 4F:
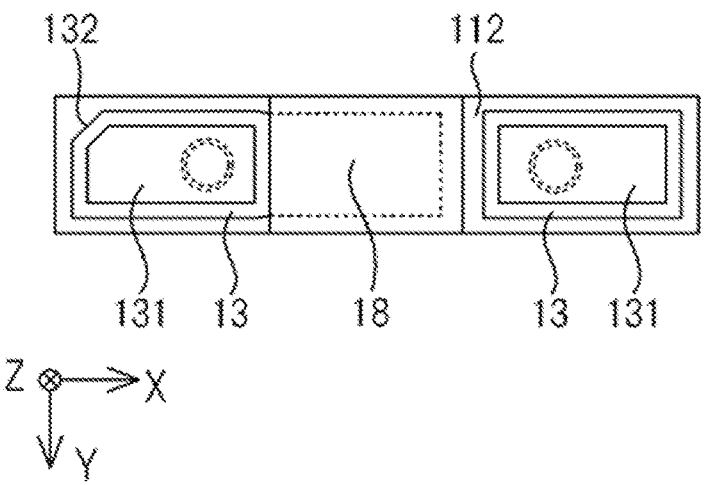
FIG. 4F is a schematic bottom view of a light-emitting device according to still another modified example of the first embodiment of the present disclosure.

As shown in FIG. 4E, one of the second wirings 13 may include a wiring recess 132 recessed in the X direction. With the wiring recess 132 in one of the second wirings 13, a part of one of the second wirings 13 that is exposed from the insulating film 18 can easily have a shape asymmetrical with respect to the center line of the exposed part of each of the second wirings 13 in the X direction of the substrate 10. With the exposed part of each of the second wirings 13 that is exposed from the insulating film 18 having a shape asymmetrical with respect to the center line of the exposed part of each of the second wirings 13 in the X direction of the substrate 10, the polarity in the light-emitting device 1000 can be recognized with reference to the wiring recess 132. In FIG. 4E, the wiring recess 132 is located at approximately the center of the substrate 10 in the Y direction. Alternatively, as shown in FIG. 4F, the wiring recess 132 may be located at an end of the substrate 10 in the Y direction.

Figure 5:
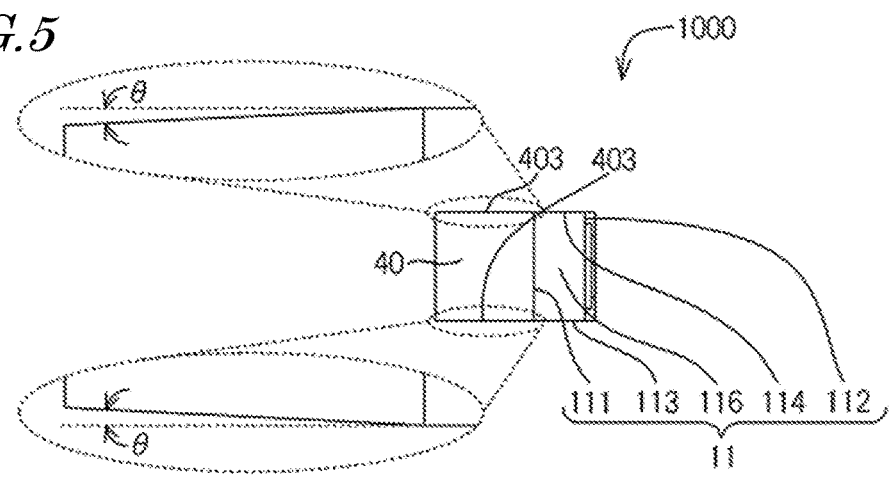
FIG. 5 is a schematic side view of the light-emitting device according to the first embodiment of the present disclosure as seen from a second shorter lateral surface.

As shown in FIG. 5, it is preferable that lateral surfaces 403 of the covering member 40 that are adjacent to the first longer lateral surface 113 and the second longer lateral surface 114 of the base member 11 are inclined inward of the light-emitting device 1000 in the Z direction. Such a structure allows for preventing contact between the lateral surface 403 of the covering member 40 and an adsorption nozzle (collet), and thus the covering member 40 can be prevented from being damaged when absorption of the light-emitting device 1000 is performed. The inclining angle θ of the covering member 40 may be of any appropriate value. The inclining angle θ is preferably 0.3 degrees or greater and 3 degrees or less, more preferably 0.5 degrees or greater and 2 degrees or less, and still more preferably 0.7 degrees or greater and 1.5 degrees or less, in view of ease of obtaining the above-described effect and strength of the covering member 40.

Figure 6:
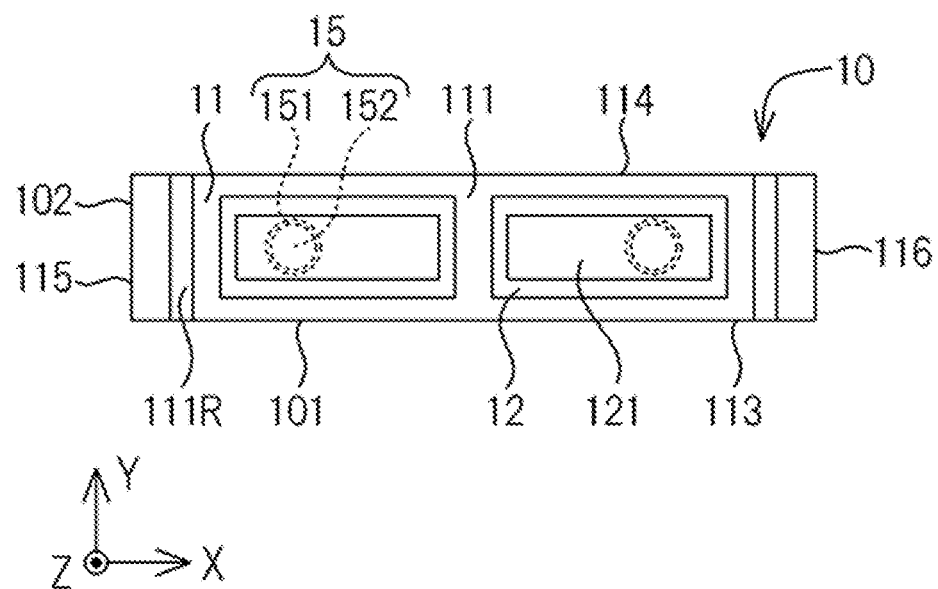
FIG. 6 is a schematic plan view of a substrate according to the first embodiment of the present disclosure.

As shown in FIG. 6, it is preferable that the first recess 111R extends in a direction substantially parallel to the shorter side 102 of the upper surface 111. With such a structure, the first recess 111R is easily formed. The first recess 111R may be formed by a known method, for example, half-dicing with the use of laser light or a blade, or etching. As described below, in the case where the first recess 111R is open at the lower surface 112, the first recess 111R may be formed by dicing. For example, the first recess 111R extending in the direction substantially parallel to the shorter side 102 of the upper surface 111 may be formed as follows by use of laser light and/or a blade in a collective substrate, in which portions to be a plurality of substrates are arranged in a matrix.

The laser light and/or the blade is moved in one direction to perform half dicing, and as a result, the first recess 111R is formed in each of the plurality of substrates. In this specification, the term "substantially parallel" indicates that deviation of ±5 degrees in angle from being parallel is allowed.

Figure 7:
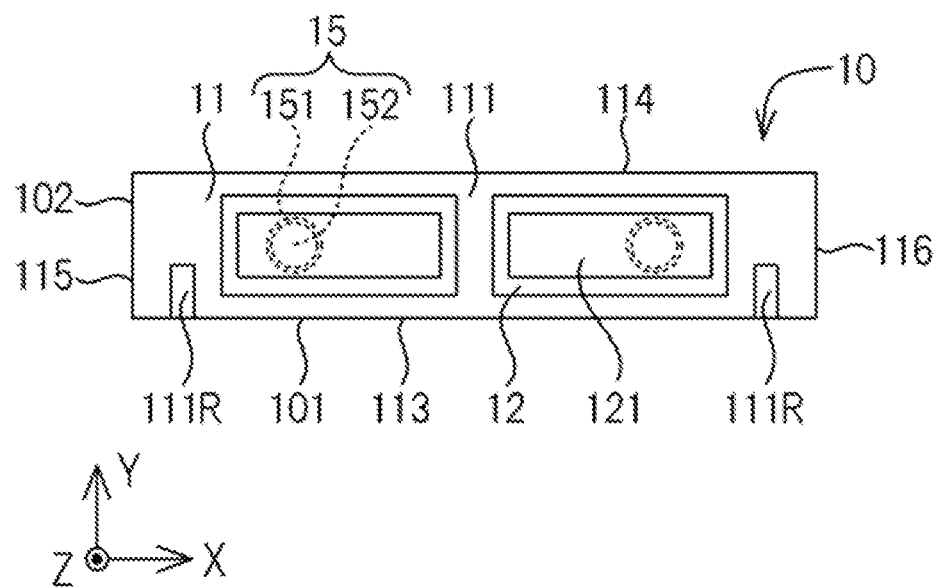
FIG. 7 is a schematic plan view of a substrate according to a modified example of the first embodiment of the present disclosure.

As shown in FIG. 7, the first recess 111R may be spaced apart from the second longer lateral surface 114. Such a structure allows for easily reducing the area of a thin portion of the base member 11, and thus strength of the base member 11 can be increased. As shown in FIG. 6, the first recess 111R may be opened in the second longer lateral surface 114. Such a structure allows for further increasing a contact area between a portion of the base member 11 the covering member 40, and thus the bonding strength between the base member 11 and the covering member 40 can be increased.

Figure 8A:
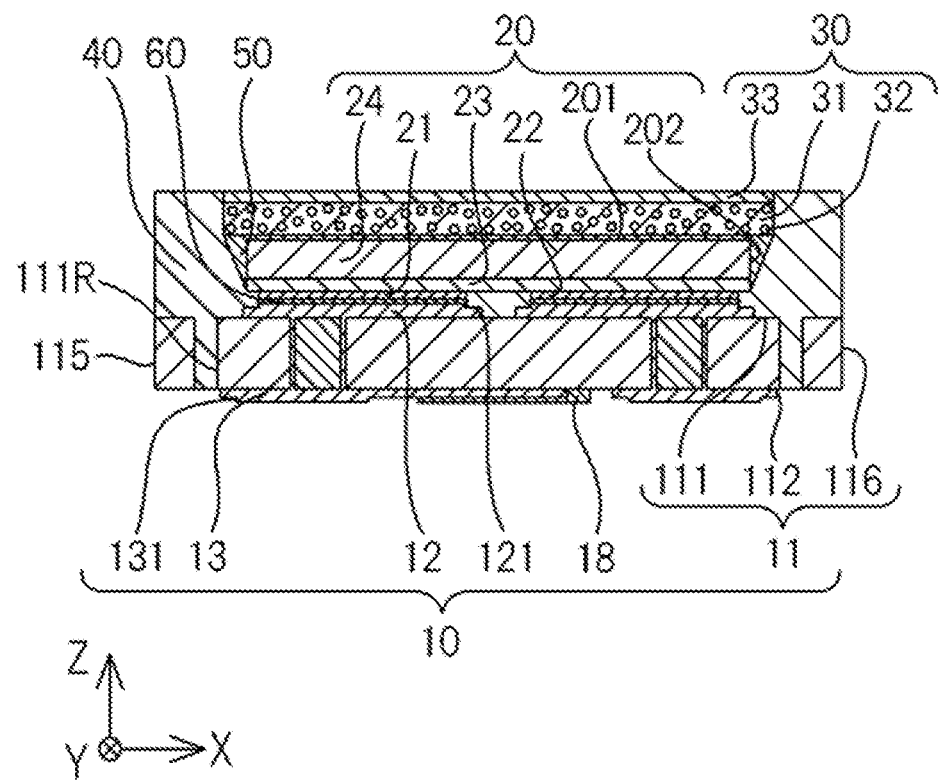
FIG. 8A is a schematic cross-sectional view of a light-emitting device according to a modified example of the first embodiment of the present disclosure.
Figure 8B:
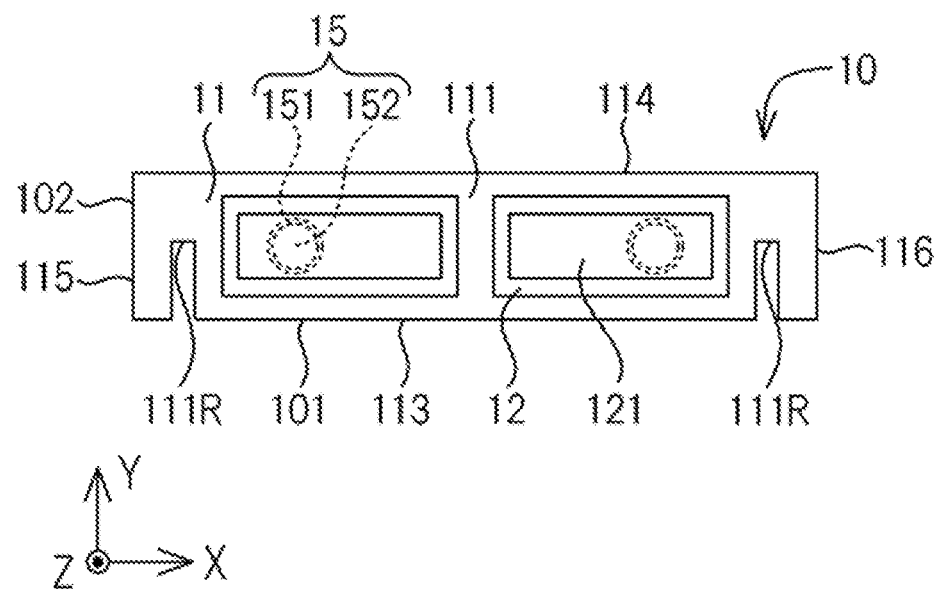
FIG. 8B is a schematic plan view of a substrate according to the modified example of the first embodiment of the present disclosure.

As shown in FIG. 8A and FIG. 8B, the first recess 111R may be open at the lower surface 112. With such a structure, the first recess 111R is easily formed. As shown in FIG. 2 and FIG. 3, the first recess 111R may be spaced apart from the lower surface 112. With the first recess 111R spaced apart from the lower surface 112, a lower surface of the first recess 111R is in contact with the covering member 40, which allows for increasing joining strength between the base member 11 and the covering member 40. As shown in FIG. 2 and FIG. 3, in the case where the first recess 111R is spaced apart from the lower surface 112, it is preferable that a distance H1 in the Z direction between the lower surface and an upper edge of the first recess 111R is 0.3 to 0.7 times a thickness 112 of the base member 11 in the Z direction. If the distance H1 is shorter than 0.3 times the thickness 112, the contact area between the base member 11 and the covering member 40 is not easily increased. If the distance H1 is longer than 0.7 times the thickness H2, a portion of the base member 11 that corresponds to the first recess 111R has a thickness reduced in the Z direction, which may decrease the strength of the base member 11.

Figure 8C:
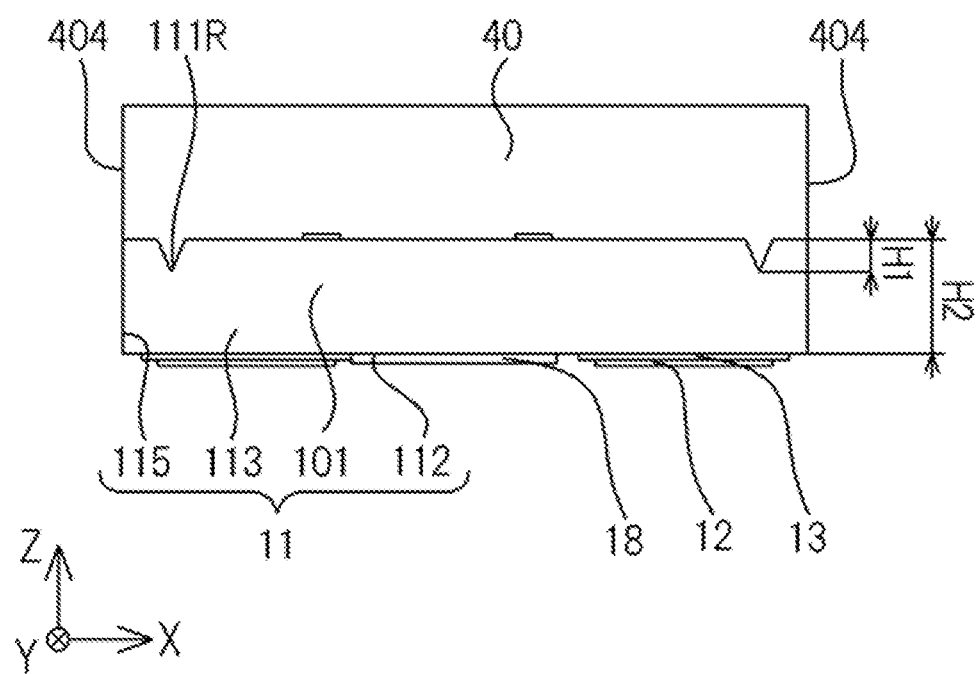
FIG. 8C is a schematic side view of the light-emitting device according to the first embodiment of the present disclosure as seen from a first longer lateral surface.

Alternatively, as shown in FIG. 8C, in the case where a thickness of the base member 11 is increased, the distance H1 in the Z direction between the upper surface and the bottom of the first recess 111R may be 0.2 to 0.8 times the thickness H2 of the base member 11 in the Z direction. In the case where a thickness of the base member 11 is increased, the distance H1 in the Z direction between the upper surface and the bottom of the first recess 111R may be 0.2 times the thickness 112 of the base member 11 in the Z direction or greater, so that the contact area between the base member 11 and the covering member 40 is easily increased. In the case where a thickness of the base member 11 is increased, the distance H1 in the Z direction between the upper surface and the bottom of the first recess 111R may be 0.8 times the thickness H2 of the base member 11 in the Z direction or less, which allows for preventing reduction in the strength of the base member 11. In this specification, the expression that the "a thickness of the base member is increased" indicates that the base member has a thickness of 0.2 mm or greater.

Figure 9A:
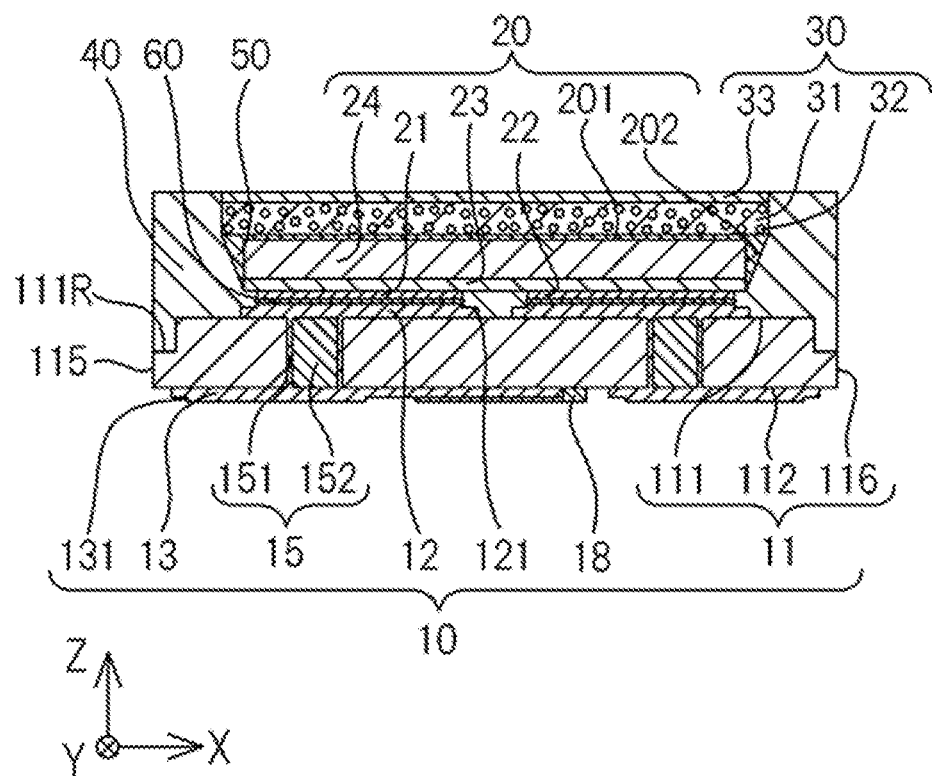
FIG. 9A is a schematic cross-sectional view of a light-emitting device according to the modified example of the first embodiment of the present disclosure.
Figure 9B:
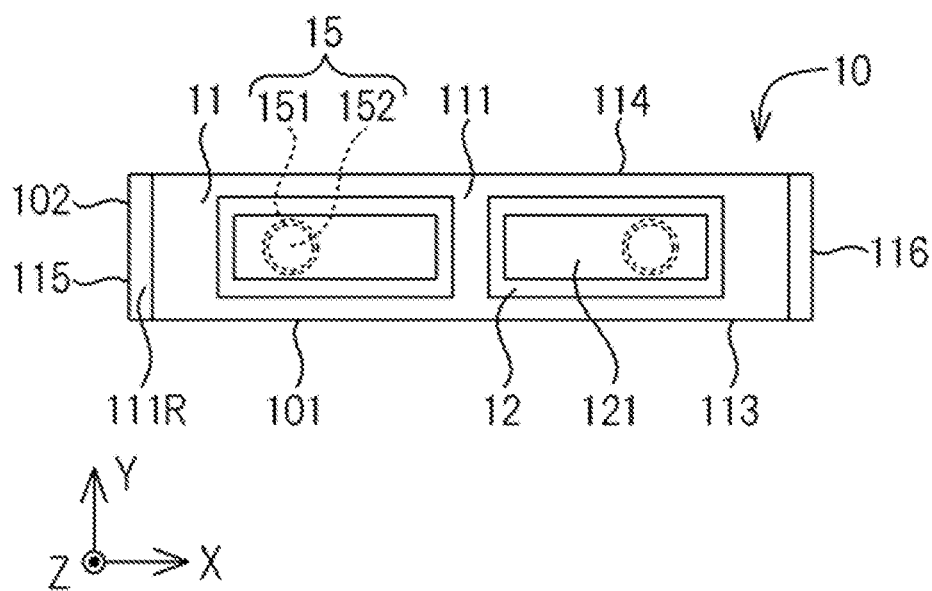
FIG. 9B is a schematic plan view of a substrate according to the modified example of the first embodiment of the present disclosure.

As shown in FIG. 9A and FIG. 9B, the first recess 111R may be open at the first shorter lateral surface 115. Such a structure allows for facilitating reduction in length of the base member 11 in the X direction, so that the size of the light-emitting device 1000 can be easily reduced. The second recess described below refers to a recess open at the upper surface 111 and the first shorter lateral surface 115 of the base member 11. Therefore, a recess shown in FIG. 9B that is open at the upper surface 111, the first longer lateral surface 113 and the first shorter lateral surface 115 is regarded as the first recess 111R and also as the second recess. A fourth recess described below refers to a recess open at the upper surface 111 and the second longer lateral surface 114 of the base member 11. Therefore, a recess shown in FIG. 9B that is open at the upper surface 111, the first longer lateral surface 113 and the second longer lateral surface 114 is regarded as the first recess 111R and also as the fourth recess. A recess that is open at the upper surface 111, the first longer lateral surface 113, the second longer lateral surface 114 and the first shorter lateral surface 115 is regarded as the first recess 111R, also as the second recess, and also as the fourth recess. As shown in FIG. 2 and FIG. 6, the first recess 111R may be spaced apart from the first shorter lateral surface 115. With the first recess 111R spaced apart from the first shorter lateral surface 115, the contact area between the base member 11 and the covering member 40 can be increased. This allows for increasing the bonding strength between the base member 11 and the covering member 40.

It is preferable that the first recess 111R is spaced apart from the light-emitting element 20 in a top view. At a portion of the base member 11 where the first recess 111R is defined, a thickness of the base member 11 (in the Z direction) is reduced or the base member 11 is penetrated between the upper surface 111 and the lower surface 112. Therefore, a portion of the base member 11 where the first recess 111R is defined is easily deformed due to thermal expansion or the like of the resin material used for the covering member 40. With the first recess 111R spaced apart from the light-emitting element 20, the stress applied to the light-emitting element 20 due to the deformation of the base member 11 can be decreased.

As shown in FIG. 10A through FIG. 10D, the first recess 111R may be open at the second longer lateral surface 114 and the first shorter lateral surface 115, and may include regions having different widths in the X direction. The width of the first recess 111R in the X direction may be gradually varied. It is preferable that, for example, a width W2 in the X direction of a portion of the first recess 111R that is open at the first longer lateral surface 113 of the base member 11 is longer than a width W1 in the X direction of a portion of the first recess 111R that is located substantially at the center of the substrate 10 in the Y direction. Such a structure allows for further increasing the contact area between the base member 11 and the covering member 40, which allows for increasing the bonding strength between the base member 11 and the covering member 40.

Figure 10A:
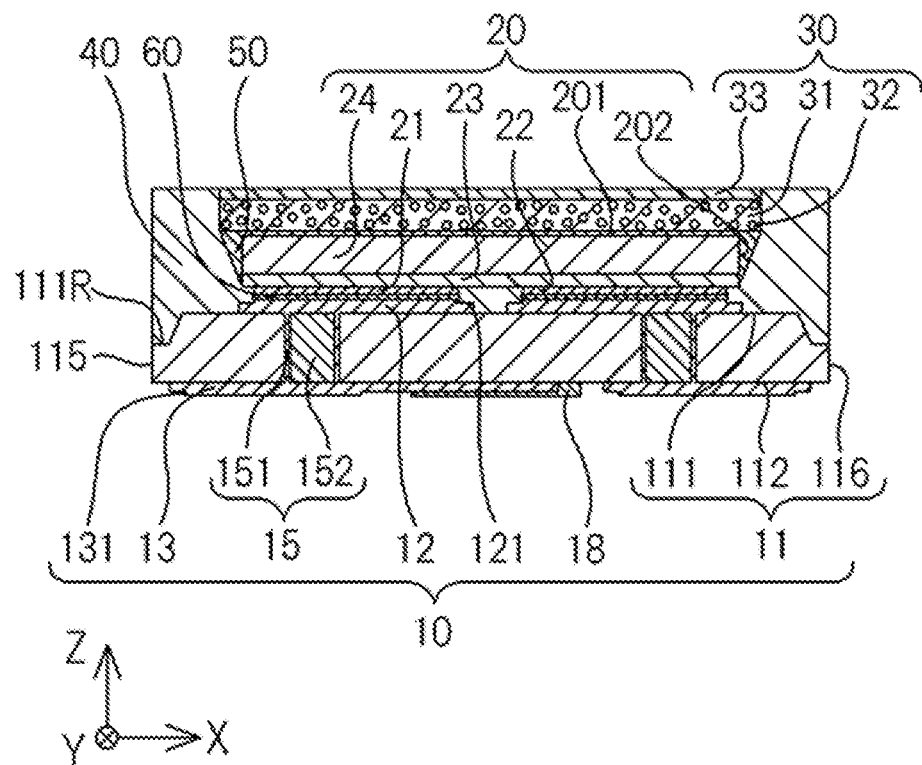
FIG. 10A is a schematic cross-sectional view of a light-emitting device according to a modified example of the first embodiment of the present disclosure.
Figure 10B:
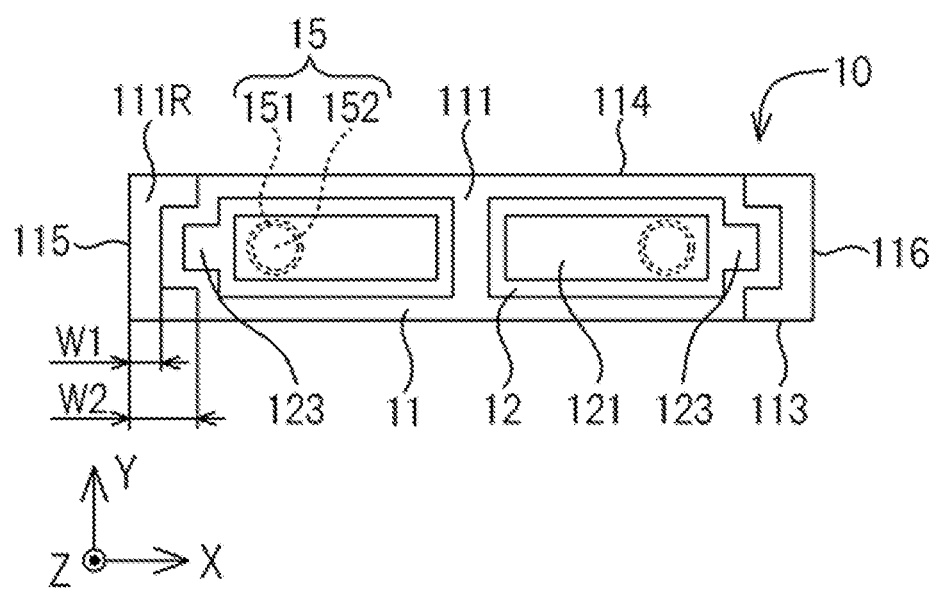
FIG. 10B is a schematic plan view of a substrate according to the modified example of the first embodiment of the present disclosure.
Figure 10C:
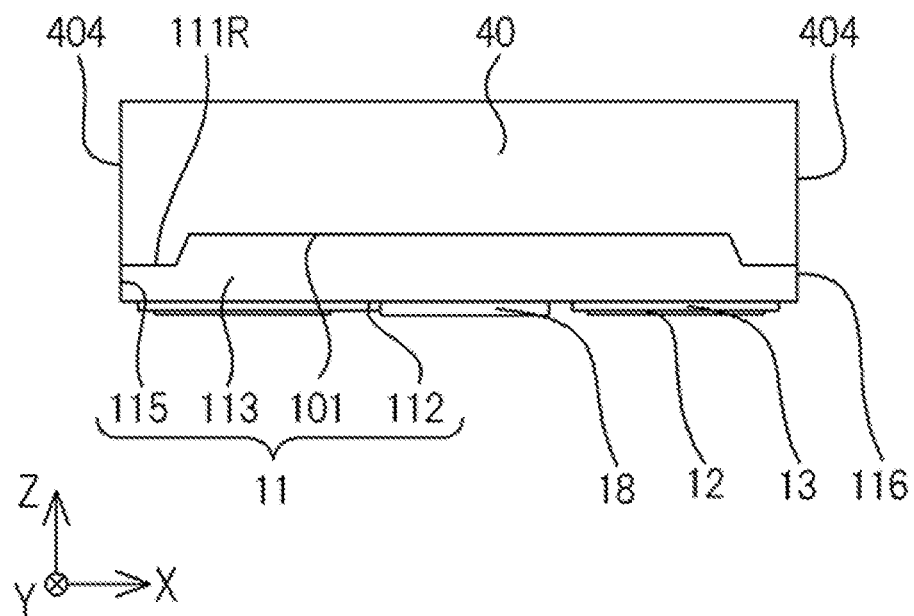
FIG. 10C is a schematic side view of the light-emitting device according to the modified example of the first embodiment of the present disclosure as seen from a first longer lateral surface.
Figure 10D:
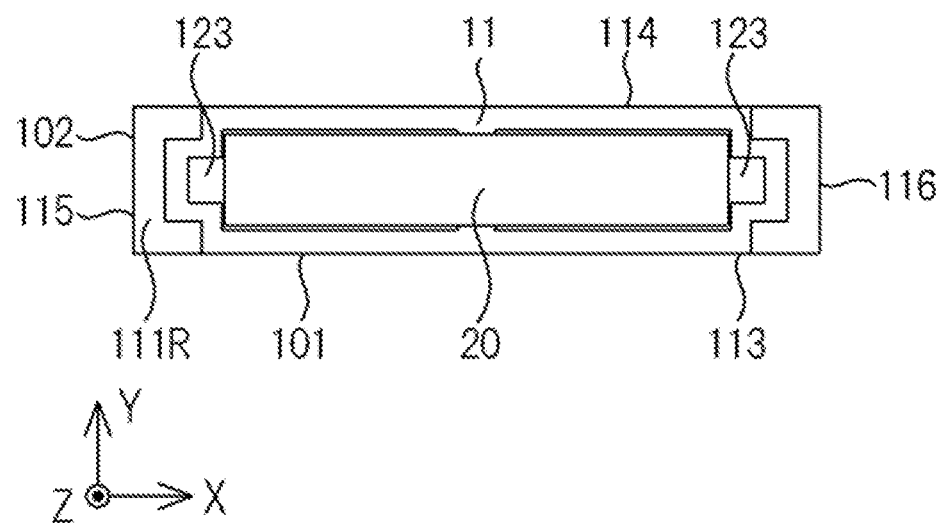
FIG. 10D is a schematic plan view of the substrate and a light-emitting element according to the modified example of the first embodiment of the present disclosure.

As shown in FIG. 10B and FIG. 10D, it is preferable that each of the first wirings 12 includes a wiring extending portion 123 extending in the X direction in a top view. As shown in FIG. 10D, in a top view, the wiring extending portion 123 extends in a +X direction and/or a −X direction from a portion of each of the first wirings 12 where the light-emitting element 20 is to be placed. With such a structure, the light-emitting element 20 can be placed on the substrate 10 using the wiring extending portion 123 as a mark. The +X direction refers to a direction extending rightward in the X direction in a top view, and a direction opposite to the +X direction is referred to as the −X direction. With the wiring extending portion 123 that is usable as a mark, the light-emitting element 20 can be easily mounted on the substrate 10. Each of the first wirings 12 may include a single wiring extending portion 123, but it is preferable that each of the first wirings 12 includes a plurality of the wiring extending portions 123. In the case where each first wiring 12 includes the plurality of wiring extending portions 123, it is preferable that the plurality of wiring extending portions 123 are located on both sides of the light-emitting element 20 in the X direction. With such a structure, the wiring extending portions 123 provided on both sides of the light-emitting element 20 in the X direction can be used as marks, and therefore, the precision of placement of the light-emitting element 20 on the substrate 10 can be improved. In the case where the light-transmissive member 30 is to be placed on the light-emitting element 20, with the wiring extending portion 123 that extends from the position where the light-transmissive member 30 is to be placed in a top view, the light-transmissive member 30 can be mounted on the substrate 10 using the wiring extending portion 123 as a mark. This allows the light-transmissive member 30 to be easily mounted on the light-emitting element 20. With the first recess 111R having the width W2 in the X direction at an opening thereof defined in the first longer lateral surface 113 of the base member 11 is longer than the width W1 of the first recess 111R in the X direction at the approximately center of the substrate 10 in the Y direction, a space in which the wiring extending portion 123 located at the center of the substrate 10 in the Y direction and extending in the X direction is formed can be secured easily.

Figure 10E:
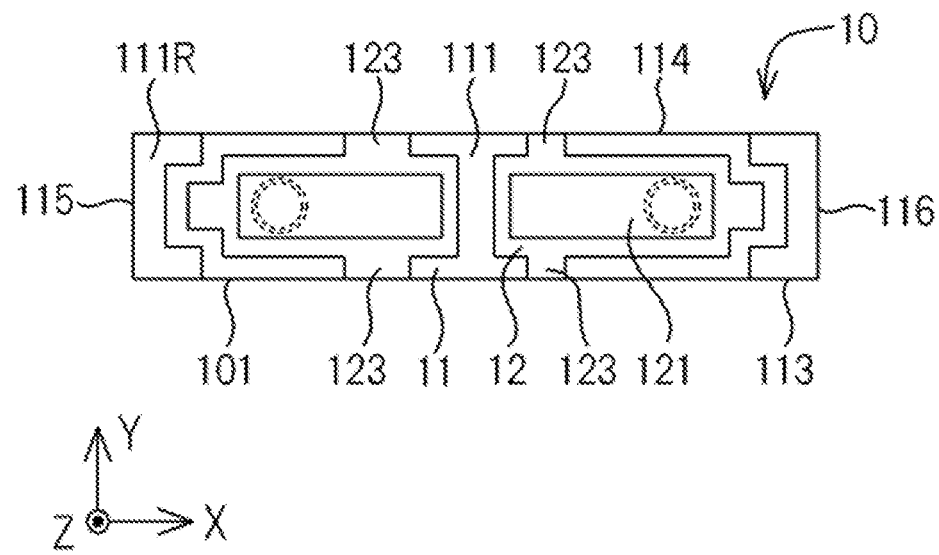
FIG. 10E is a schematic plan view of a substrate according to a modified example of the first embodiment of the present disclosure.
Figure 10F:
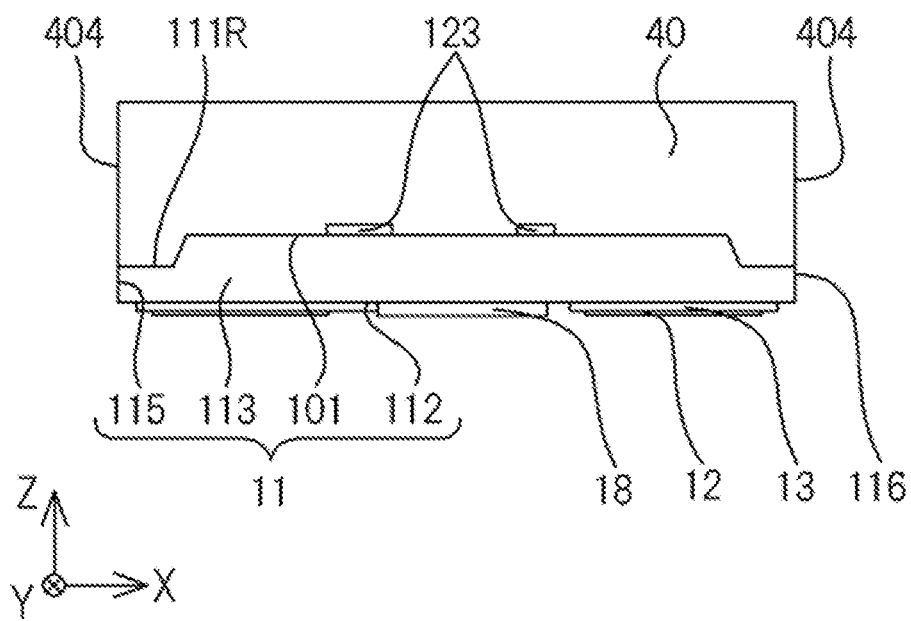
FIG. 10F is a schematic side view of a light-emitting device according to the modified example of the first embodiment of the present disclosure as seen from a first longer lateral surface.

As shown in FIG. 10E, each of the first wirings 12 may include the wiring extending portion 123 extending to the first longer lateral surface 113 and/or the second longer lateral surface 114 of the base member 11. In the case where each of the first wirings 12 includes the wiring extending portion 123 extending to the first longer lateral surface 113 and/or the second longer lateral surface 114 of the base member 11, it is preferable that, as shown in FIG. 10F, a portion of the wiring extending portion 123 that is exposed from the covering member 40 is asymmetrical with respect to the center line of the substrate 10 in the X direction as seen from the first longer lateral surface 113 and/or the second longer lateral surface 114. With such a structure, the polarity in the light-emitting device 1000 can be recognized with reference to, for example, the position and/or the size of a part of the wiring extending portion 123 exposed from the covering member 40.

Figure 11A:
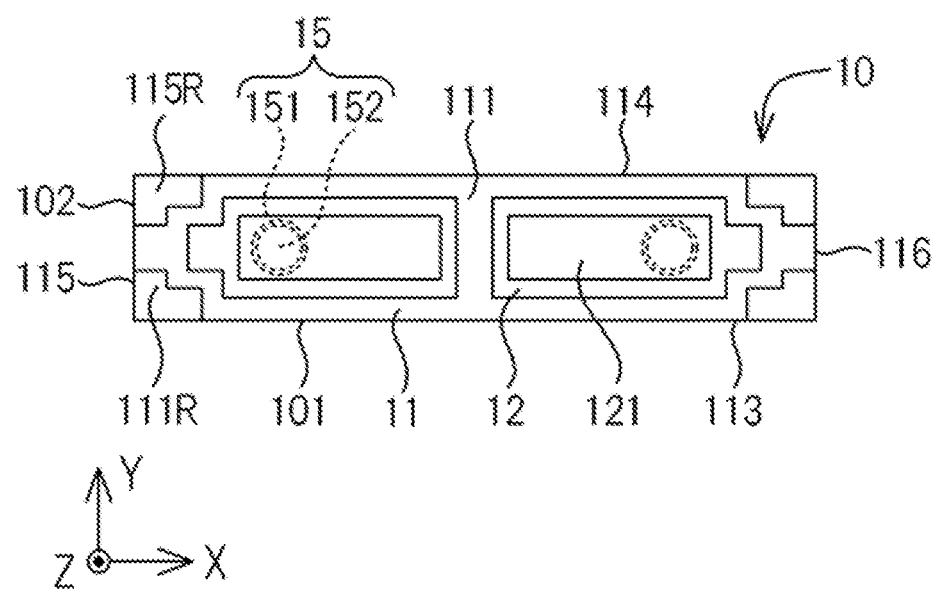
FIG. 11A is a schematic plan view of a substrate according to a modified example of the first embodiment of the present disclosure.
Figure 11B:
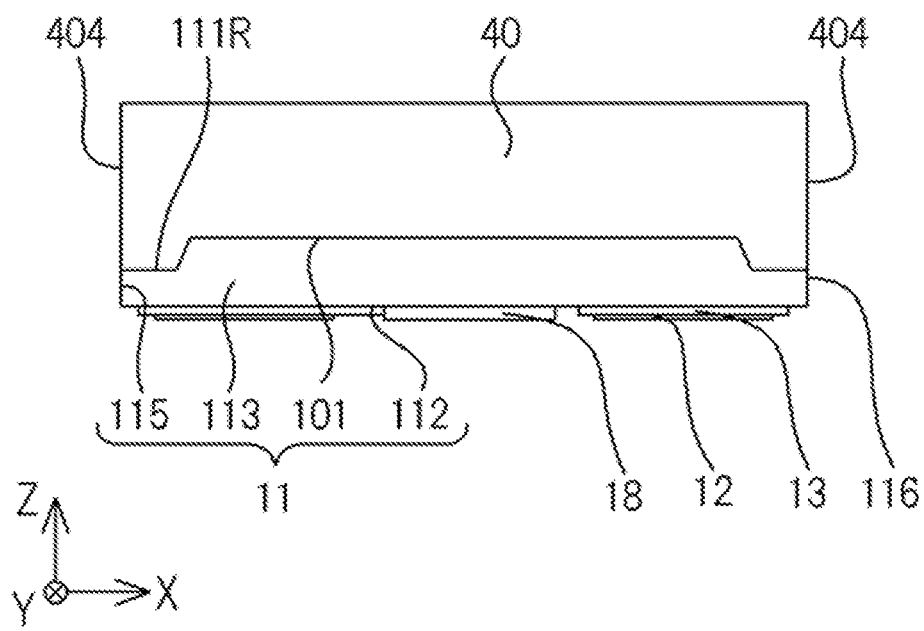
FIG. 11B is a schematic side view of a light-emitting device according to the modified example of the first embodiment of the present disclosure as seen from a first longer lateral surface.
Figure 11C:
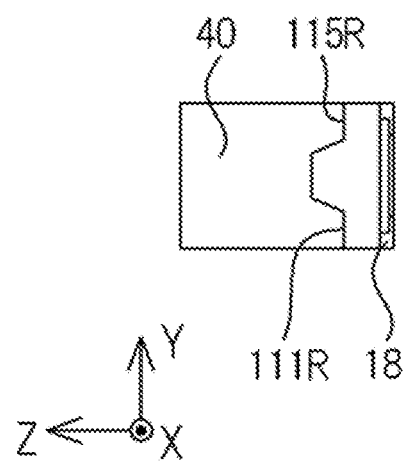
FIG. 11C is a schematic side view of the light-emitting device according to the modified example of the first embodiment of the present disclosure as seen from a second shorter lateral surface.

As shown in FIG. 11A through FIG. 11C, the base member 11 may include at least one fourth recess (represented by reference numeral 115R in FIG. 15 and the like) open at the upper surface 111 and the second longer lateral surface 114. The fourth recess 115R may be open at the first shorter lateral surface 115, similarly to the first recess 111R. The fourth recess 115R defined in the base member 11 allows for further increasing the contact area size of the base member 11 and the covering member 40, so that the bonding strength between the base member 11 and the covering member 40 can be increased. It is preferable that the first recess 111R and the fourth recess 115R are line-symmetrical to each other with respect to the center line of the substrate 10 in the Y direction. In the case where the first recess 111R and the fourth recess 115R, are formed in a collective substrate, in which portions to be a plurality of the substrates 10 are arranged in a matrix, the first recess 111R and the fourth recess 115R of adjacent ones of the portions to be the plurality of the substrates 10 may be formed at once. This allows for facilitating producing of the light-emitting device 1000. The first recess 111R and/or the fourth recess 115R may have a width that is constant or varied in the X direction. In the case where the first recess 111R and/or the fourth recess 115R includes regions having different widths in the X direction, the contact area between the base member 11 and the covering member 40 can be further increased, so that the bonding strength between the base member 11 and the covering member 40 can be increased.

Figure 11D:
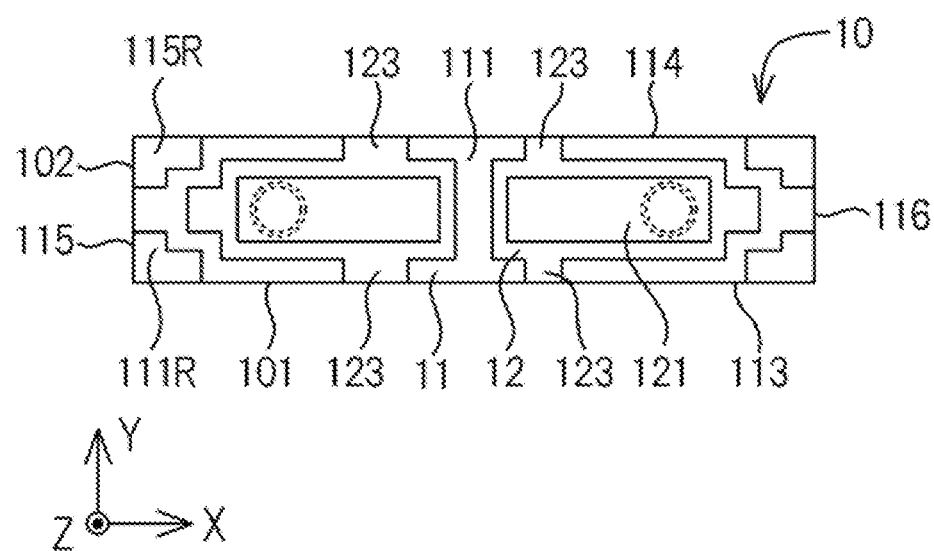
FIG. 11D is a schematic plan view of a substrate according to a modified example of the first embodiment of the present disclosure.
Figure 11E:
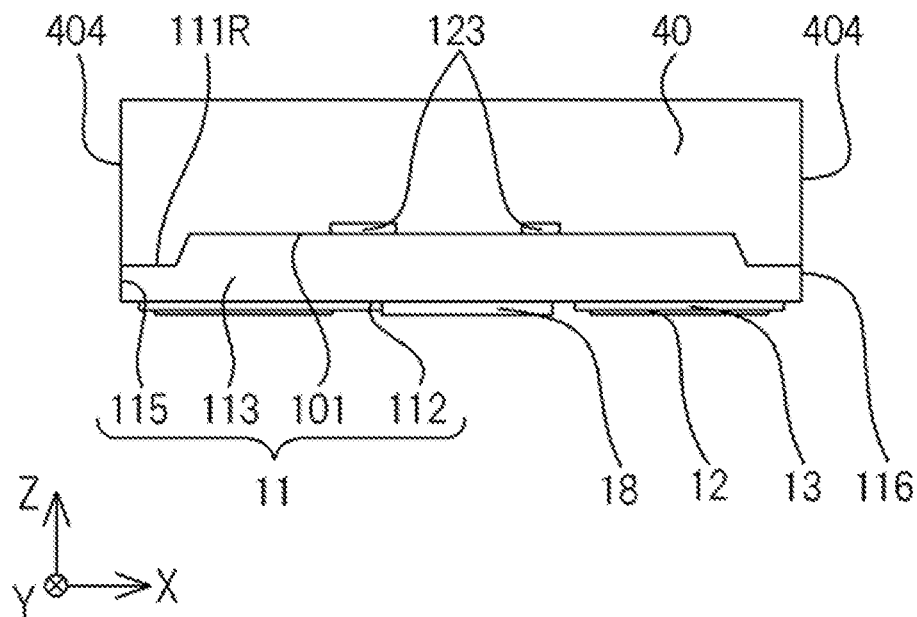
FIG. 11E is a schematic side view of a light-emitting device according to the modified example of the first embodiment of the present disclosure as seen from the first longer lateral surface.

As shown in FIG. 11D, each of the first wirings 12 may include the wiring extending portion 123 extending to the first longer lateral surface 113 and/or the second longer lateral surface 114 of the base member 11. In the case where each of the first wirings 12 includes the wiring extending portion 123 extending to the first longer lateral surface 113 and/or the second longer lateral surface 114 of the base member 11, it is preferable that, as shown in FIG. 11E, a portion of the wiring extending portion 123 that is exposed from the covering member 40 is asymmetrical with respect to the center line of the substrate 10 in the X direction as seen from the first longer lateral surface 113 and/or the second longer lateral surface 114. With such a structure, the polarity in the light-emitting device 1000 can be recognized with reference to, for example, the position and/or the size of a part of the wiring extending portion 123 exposed from the covering member 40.

Figure 12A:
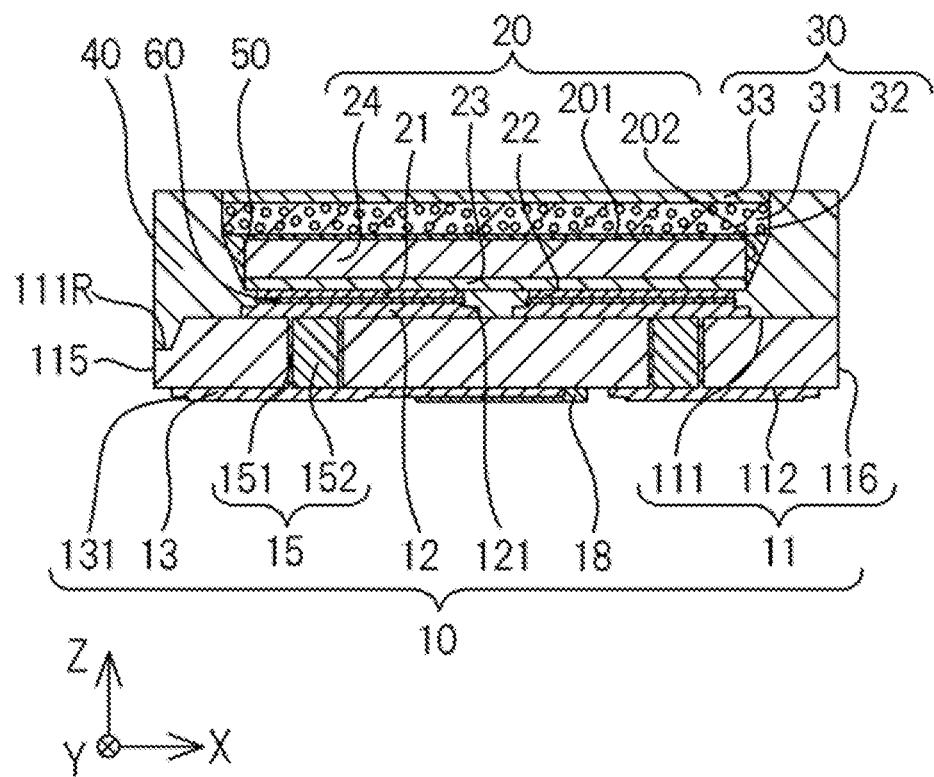
FIG. 12A is a schematic cross-sectional view of a light-emitting device according to a modified example of the first embodiment of the present disclosure.
Figure 12B:
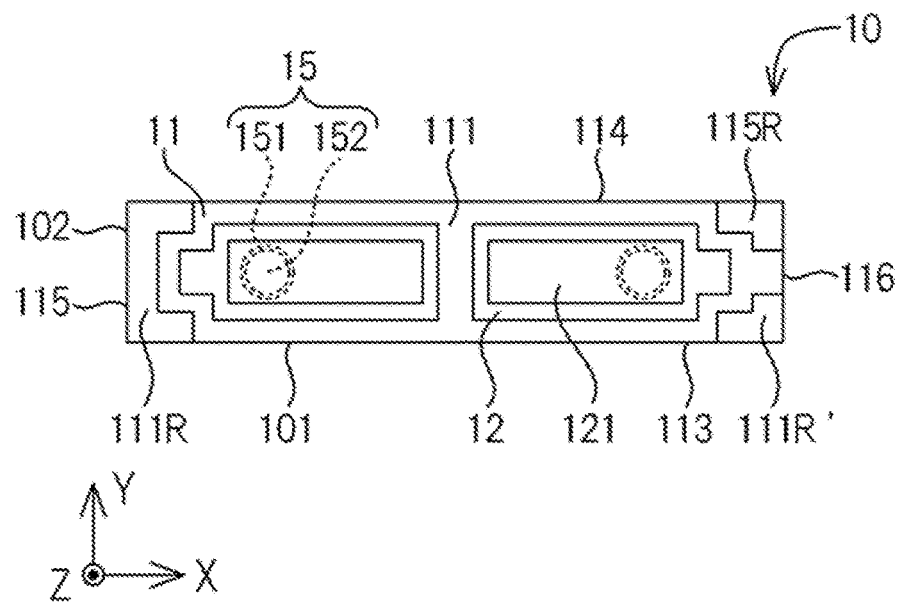
FIG. 12B is a schematic plan view of a substrate according to the modified example of the first embodiment of the present disclosure.
Figure 12C:
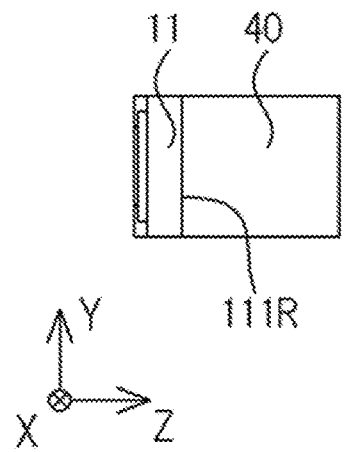
FIG. 12C is a schematic side view of the light-emitting device according to the modified example of the first embodiment of the present disclosure as seen from a first shorter lateral surface.
Figure 12D:
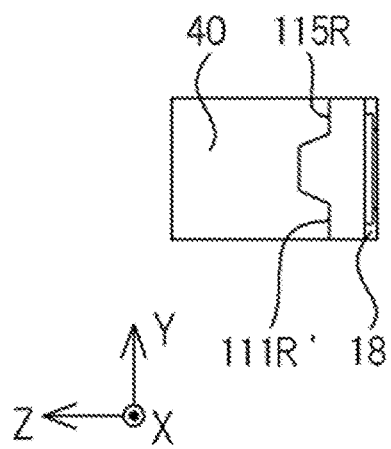
FIG. 12D is a schematic side view of the light-emitting device according to the modified example of the first embodiment of the present disclosure as seen from a second shorter lateral surface.

The first recess 111R may be defined at each of both ends of the base member 11 in the X direction, and the first recess 111R at the end on the +X side and the first recess 111R at the end on the −X side may have shapes different from each other. In a top view, a right side of the light emitting device in the X direction is referred to as a "+X side", and a left side thereof is referred to as a "−X side". For example, referring to FIG. 12A through FIG. 12D, the first recess 111R at the −X side is open at the first shorter lateral surface 115 and also at the second longer lateral surface 114. A first recess 111W at the +X side is open at the second shorter lateral surface 116 but is spaced apart from the second longer lateral surface 114. With such a structure, in the case where the lateral surfaces 404 of the covering member 40 that are adjacent to the first shorter lateral surface 115 and the second shorter lateral surface 116 of the base member 11 is in substantially the same plane as that of the first shorter lateral surface 115 and the second shorter lateral surface 116 of the base member 11, respectively, a lateral surface of the light-emitting device 1000 as seen from the first shorter lateral surface 115 has a shape different from a shape of a lateral surface of the light-emitting device 1000 as seen from the second shorter lateral surface 116 as shown in FIG. 12C and FIG. 12D. With such shapes, the polarity in the light-emitting device 1000 can be recognized with reference to the shape of the lateral surface of the light-emitting device 1000 as seen from the first shorter lateral surface 115 and/or the second shorter lateral surface 116.

Figure 13A:
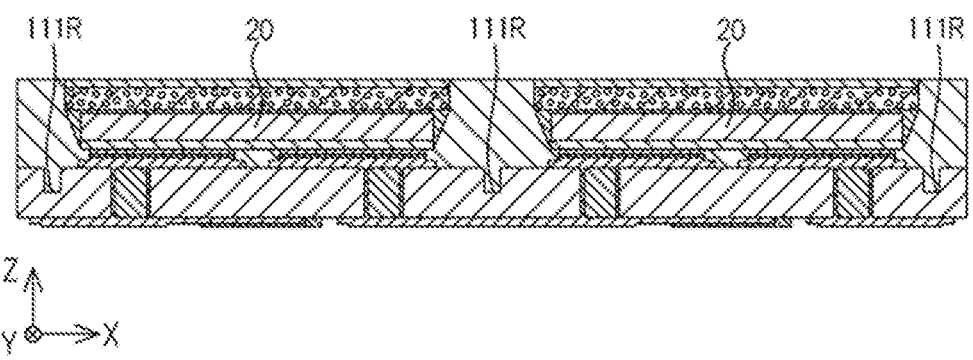
FIG. 13A is a schematic cross-sectional view of a light-emitting device according to a modified example of the first embodiment of the present disclosure.
Figure 13B:
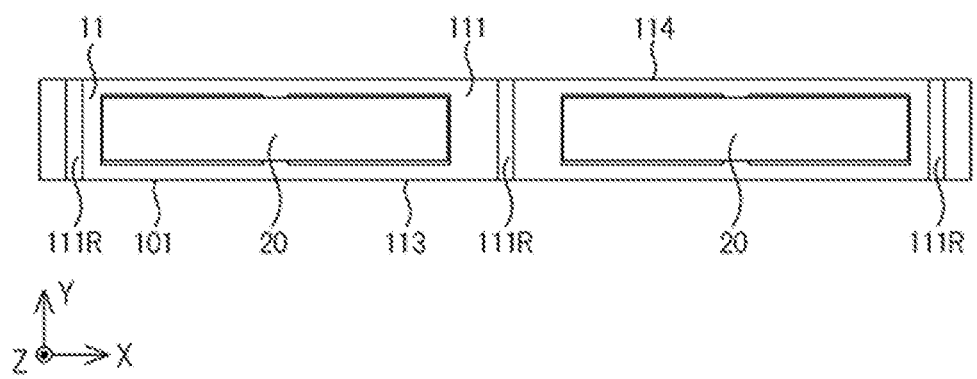
FIG. 13B is a schematic plan view of a substrate and a light-emitting element according to the modified example of the first embodiment of the present disclosure.
Figure 14:
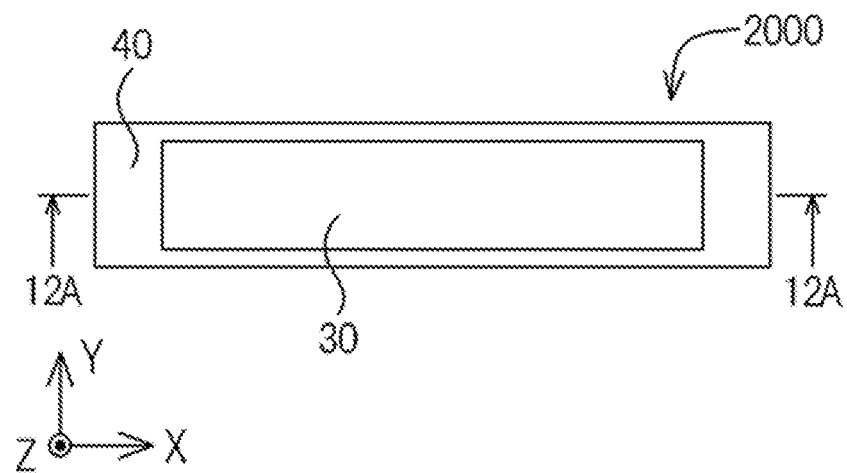
FIG. 14 is a schematic plan view of a light-emitting device according to a second embodiment of the present disclosure.

As shown in FIG. 13A and FIG. 13B, the light-emitting device 1000 may include a plurality of the light-emitting elements 20. In the case where the light-emitting device 1000 includes the plurality of light-emitting elements 20, it is preferable that the plurality of light-emitting elements 20 are arranged in the X direction. Such a structure allows for reducing the width of the light-emitting device 1000 in the Y direction, and thus allows the light-emitting device 1000 to be thinner. Two light-emitting elements 20 are arranged in FIG. 13A, but alternatively, three or more light-emitting elements 20 or one light-emitting element 20 may be arranged. The first recess 111R may be provided between the plurality of light-emitting elements 20. Such a structure allows for increasing the joining strength between the base member 11 and the covering member 40 at regions between the light-emitting elements 20.

Second Embodiment

With reference to FIG. 14 through FIG. 19, a light-emitting device 2000 in a second embodiment according to the present disclosure will be described. The light-emitting device 2000 is substantially the same as the light-emitting device 1000 in a first embodiment except that the base member 11 includes at least one second recess (represented by reference numeral 112R in FIG. 15 and the like).

The light-emitting device 2000 includes the substrate 10, at least one light-emitting element 20, and the covering member 40. The substrate 10 includes the base member 11, the first wirings 12, and the second wirings 13. The base member 11 has a substantially rectangular upper surface 111, a lower surface 112 opposite to the upper surface 111, a first longer lateral surface 113 adjacent to a longer side 101 of the upper surface 111 and perpendicular to the upper surface 111, a second longer lateral surface 114 opposite to the first longer lateral surface 113, a first shorter lateral surface 115 adjacent to the shorter side 102 of the upper surface 111 and perpendicular to the upper surface 111, and a second shorter lateral surface 116 opposite to the first shorter lateral surface 115. Further, the base member 11 has at least one second recess 112R open in the upper surface 111 and the first shorter lateral surface 115. The first wirings 12 are disposed on the upper surface 111 of the base member 11. The second wirings 13 are disposed on the lower surface 112 of the base member 11, and are electrically connected with the first wirings 12. At least one light-emitting element 20 is electrically connected with the first wirings 12, and is disposed on the first wirings 12. The covering member 40 is light-reflective, and covers lateral surfaces 202 of the light-emitting element 20 and the upper surface 111 of the base member 11. The covering member 40 also covers surfaces defining the second recess 112R.

With the covering member 40 covering the surfaces defining the second recess 112R, the contact area between the base member 11 and the covering member 40 can be increased. This allows for increasing joining strength between the base member 11 and the covering member 40. With the second recess 112R open at the first shorter lateral surface 115, the joining strength between, especially, the base member 11 and the covering member 40 is increased at the first shorter lateral surface 115. Due to increase in joining strength between the base member 11 and the covering member 40 at the first shorter lateral surface 115, detachment between the base member 11 and the covering member 40 can be prevented even if an external force is applied to the covering member 40 from a first shorter lateral surface 115 side. The second recess 112R may be open at the lower surface 112 or may be spaced apart from the lower surface 112. The second recess 112R may have any appropriate shape as seen in a cross-sectional view. The second recess 112R may have, for example, a substantially quadrangular shape, a substantially V-shape, or the like in a cross-sectional view.

One second recess 112R may be provided, but it is preferable that a plurality of the second recesses 112R are provided. With the plurality of second recesses 112R, the contact area of the base member 11 and the covering member 40 can be further increased, which allows for increasing the joining strength of the base member 11 and the covering member 40. In the case where the plurality of second recesses 112R are provided, it is preferable that the light-emitting element 20 is disposed between the plurality of second recesses 112R in a top view. With such a structure, the joining strength between the base member 11 and the covering member 40 is easily increased in a wide area of the upper surface 111 of the base member 11.

Figure 16:
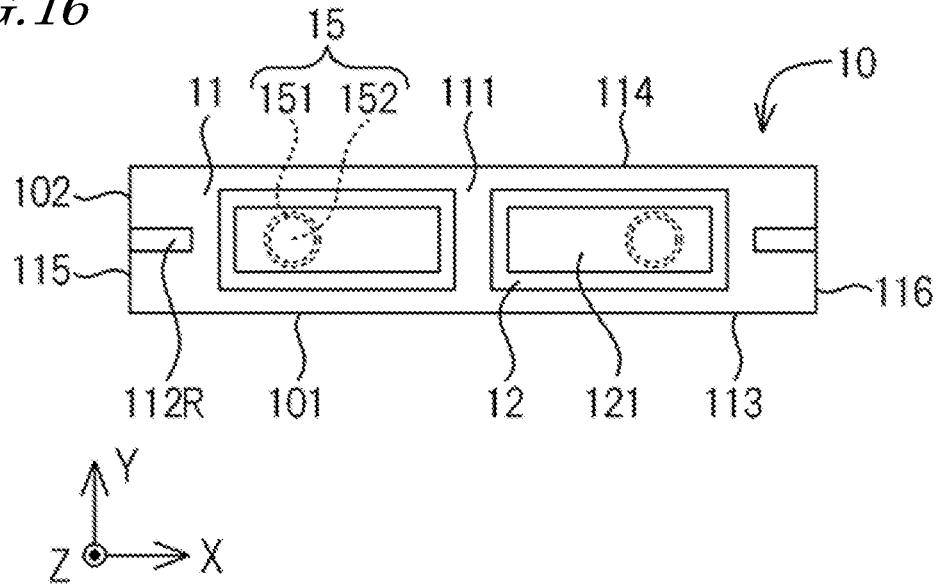
FIG. 16 is a schematic plan view of a substrate according to the second embodiment of the present disclosure.

As shown in FIG. 16, it is preferable that the second recess 112R extends in a direction generally parallel to the longer side 101 of the upper surface 111. With such a structure, the second recess 112R is easily formed. The second recess 112R may be formed by a known method, as in forming of the first recess 111R. For example, the second recess 112R extending in the direction parallel to the longer side 101 of the upper surface 111 may be formed using laser light or the like in a collective substrate in which portions to be a plurality of the substrates are arranged in a matrix. The laser light is moved in one direction to perform half dicing, and as a result, the second recess 112R is formed in each of the plurality of substrates.

Figure 17A:
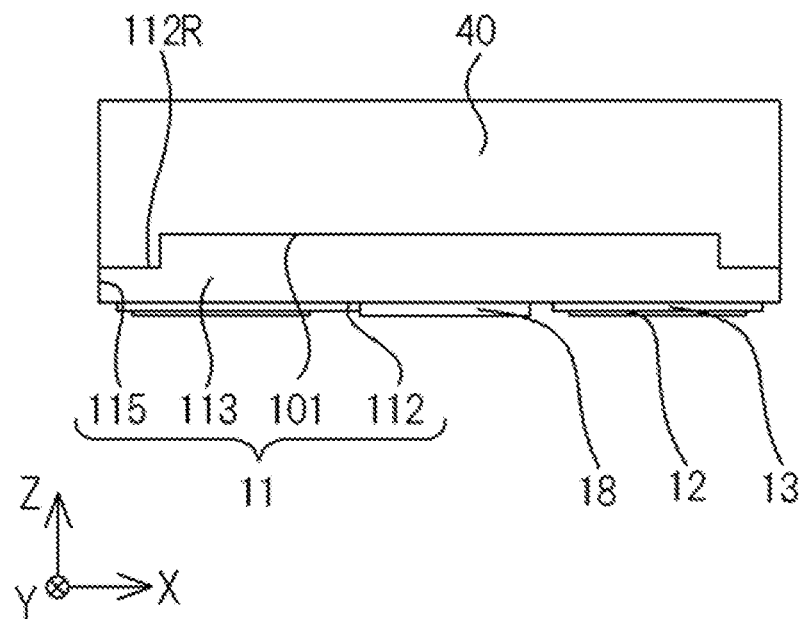
FIG. 17A is a schematic side view of a light-emitting device according to a modified example of the second embodiment of the present disclosure as shown from a first longer lateral surface.
Figure 17B:
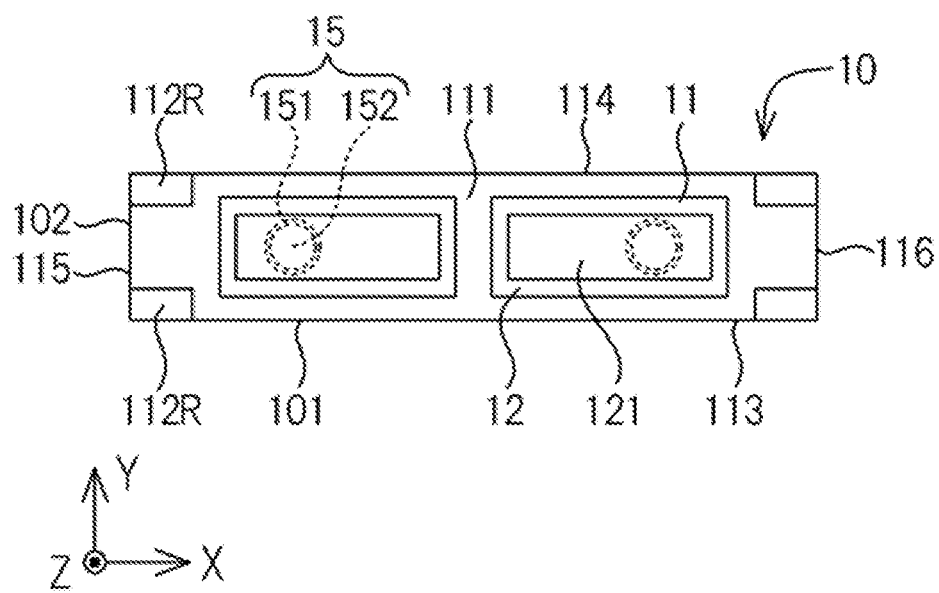
FIG. 17B is a schematic plan view of a substrate according to the modified example of the second embodiment of the present disclosure.

As shown in FIG. 17A and FIG. 17B, the second recess 112R may be open at the first longer lateral surface 113 and/or the second longer lateral surface 114. With such a structure, the joining strength between, especially, the base member 11 and the covering member 40 is increased at the first longer lateral surface 113 side and/or the second longer lateral surface 114 side. Increase in joining strength between the base member 11 and the covering member 40 at the first longer lateral surface 113 side and/or the second longer lateral surface 114 side allows for preventing detachment between the base member 11 and the covering member 40, even if an external force is applied to the covering member 40 at the first longer lateral surface 113 and/or the second longer lateral surface 114 side. Alternatively, as shown in FIG. 16, the second recess 112R may be spaced apart from the first longer lateral surface 113 and the second longer lateral surface 114. With the second recess 112R spaced apart from the first longer lateral surface 113 and the second longer lateral surface 114, the contact area between the base member 11 and the covering member 40 can be increased. This allows for increasing the joining strength between the base member 11 and the covering member 40.

Figure 15:
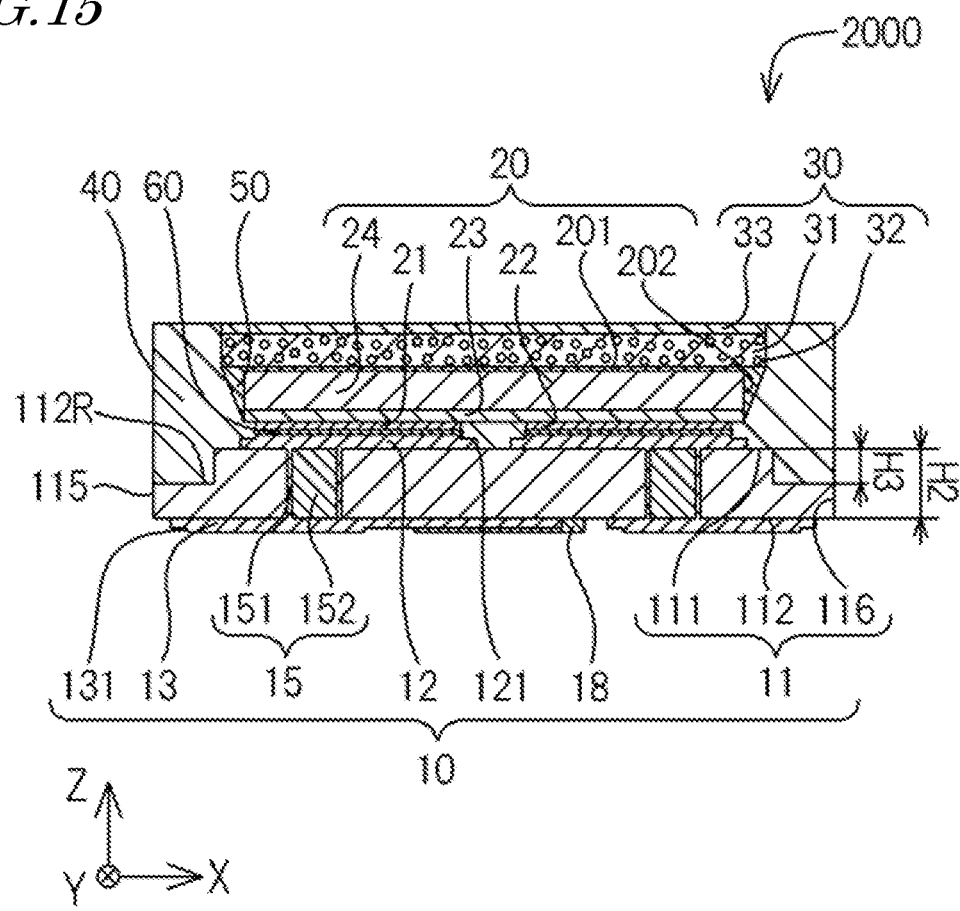
FIG. 15 is a schematic cross-sectional view taken along line 12A-12A in FIG. 14.
Figure 18A:
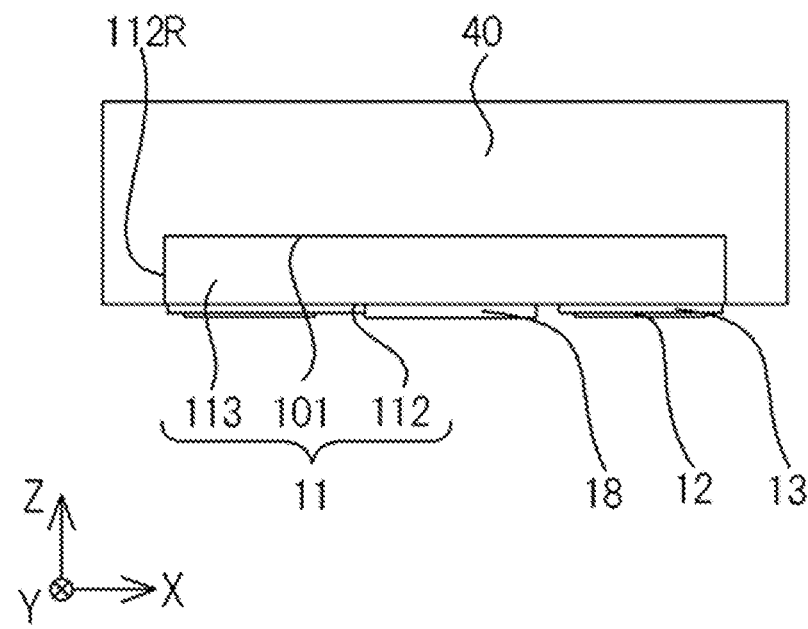
FIG. 18A is a schematic side view of a light-emitting device according to a modified example of the second embodiment of the present disclosure as seen from a first longer lateral surface.
Figure 18B:
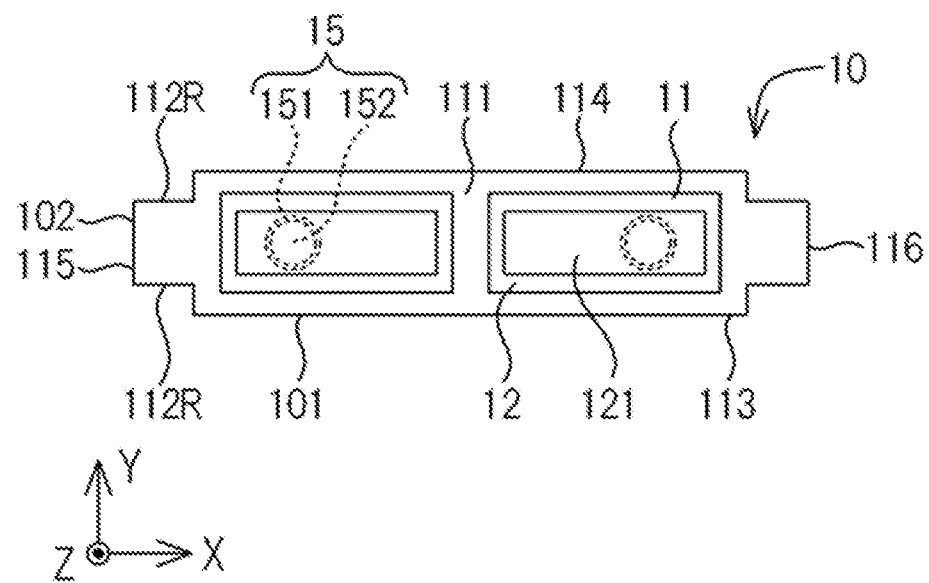
FIG. 18B is a schematic plan view of a substrate according to the modified example of the second embodiment of the present disclosure.

As shown in FIG. 18A and FIG. 18B, the second recess 112R may be open at the lower surface 112. With such a structure, the second recess 112R is easily formed. As shown in FIG. 15, the second recess 112R may be spaced apart from the lower surface 112. With the second recess 112R spaced apart from the lower surface 112, a bottom surface of the second recess 112R is in contact with the covering member 40, which allows for increasing the joining strength between the base member 11 and the covering member 40. As shown in FIG. 15, in the case where the second recess 112R is spaced apart from the lower surface 112, it is preferable that a distance 113 in the Z direction from the bottom surface to a upper edge of the second recess 112R is 0.3 to 0.7 times the thickness 112 of the base member 11 in the Z direction. If the distance 113 is shorter than 0.3 times the thickness 112, the contact area between the base member 11 and the covering member 40 is not easily increased. If the distance 113 is longer than 0.7 times the thickness 112, a portion of the base member 11 that corresponds to the second recess 112R has a thickness reduced in the Z direction, which may decrease the strength of the base member 11.

Figure 19:
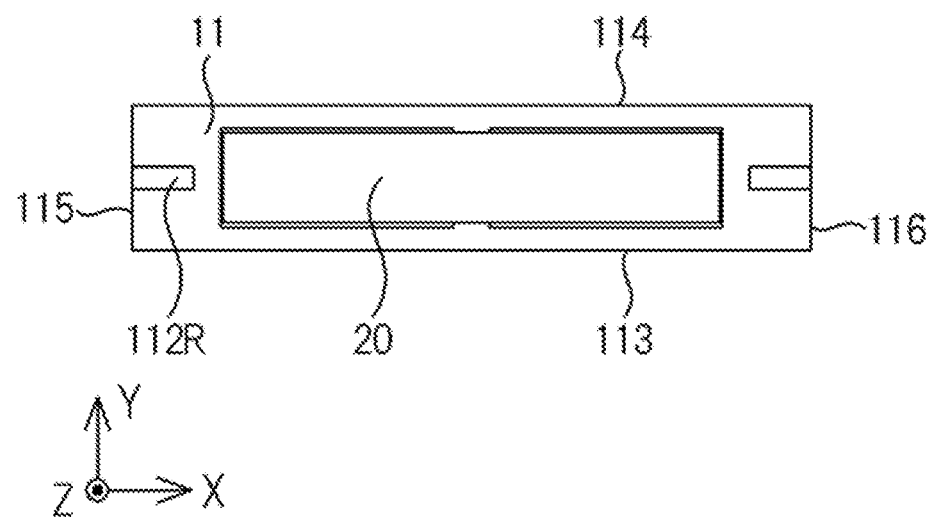
FIG. 19 is a schematic plan view of the substrate and a light-emitting element according to the second embodiment of the present disclosure.
Figure 20:
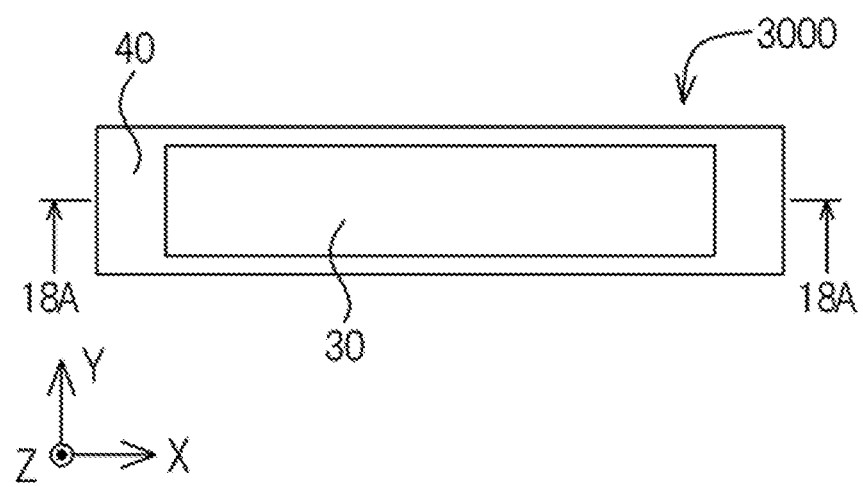
FIG. 20 is a schematic plan view of a light-emitting device according to a third embodiment of the present disclosure.
Figure 21:
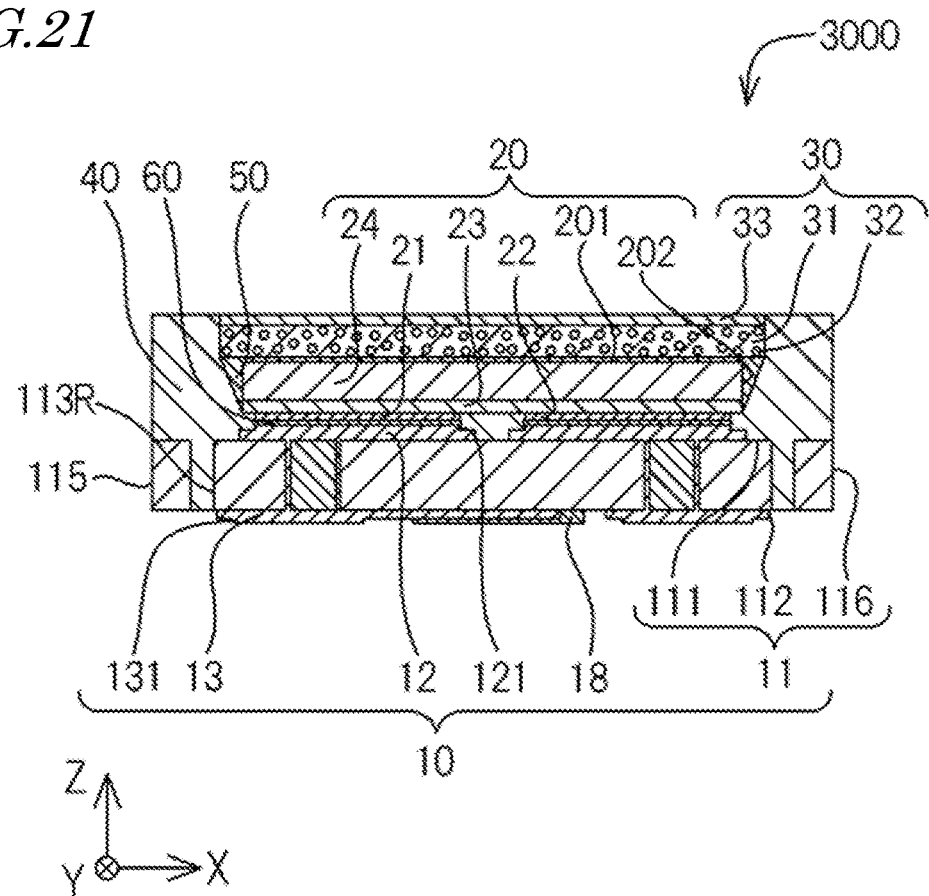
FIG. 21 is a schematic cross-sectional view taken along line 18A-18A in FIG. 20.
Figure 22:
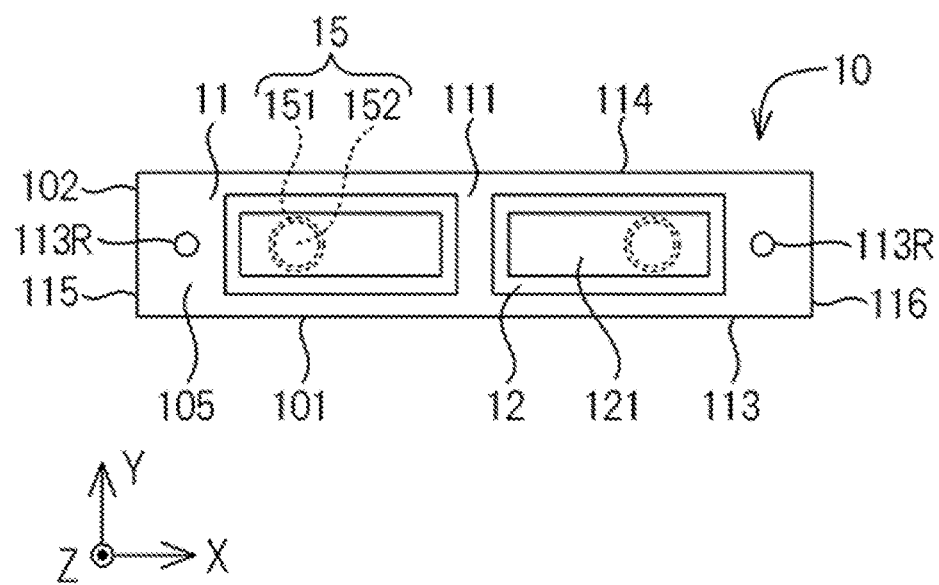
FIG. 22 is a schematic plan view of a substrate according to the third embodiment of the present disclosure.

As shown in FIG. 19, it is preferable that the second recess 112R is spaced apart from the light-emitting element 20 in a top view. At a portion where the second recess 112R is defined, a thickness of the base member 11 (in the Z direction) is reduced, or is penetrated between the upper surface 111 and the lower surface 112. Therefore, such portion of the base member 11 is easily deformed due to thermal expansion or the like of the resin material used for the covering member 40. With the second recess 112R spaced apart from the light-emitting element 20 in a top view, stress applied to the light-emitting element 20 by deformation of the base member 11 can be decreased.

Third Embodiment

With reference to FIG. 20 through FIG. 23, a light-emitting device 3000 according to a third embodiment of the present invention will be described.

The light-emitting device 3000 is substantially the same as the light-emitting device 1000 in the first embodiment except that a base member 11 includes a plurality of through-holes (represented by reference numeral 113R in FIG. 21 and the like) and that a surface defining each of the through-holes 113R is covered with the covering member 40.

The light-emitting device 3000 includes a substrate 10, at least one light-emitting element 20, and a covering member 40. The substrate 10 includes the base member 11, first wirings 12, and second wirings 13. The base member 11 has an upper surface 111 having a substantially rectangular shape, a lower surface 112 opposite to the upper surface 111, and lateral surfaces located between the upper surface 111 and the lower surface 112. Further, the base member 11 includes a plurality of through-holes 113R apart from the lateral surfaces of the base member 11 and extending between the upper surface 111 and the lower surface 112 of the base member 11. The first wirings 12 are disposed on the upper surface 111 of the base member 11. The second wirings 13 are disposed on the lower surface 112 of the base member 11, and each of the second wirings 13 is electrically connected with a respective one of the first wirings 12. At least one light-emitting element 20 is electrically connected with the first wirings 12, and are disposed on the first wirings 12. The covering member 40 is light-reflective, and covers the lateral surfaces 202 of the light-emitting element 20 and the upper surface 111 of the base member 11. The covering member 40 also covers the surfaces defining the plurality of through-holes 113R. The lateral surfaces of the base member 11 include a first longer lateral surface 113 adjacent to a longer side 101 of the upper surface 111 and perpendicular to the upper surface 111, a second longer lateral surface 114 opposite to the first longer lateral surface 113, a first shorter lateral surface 115 adjacent to a shorter side 102 of the upper surface 111 and perpendicular to the upper surface 111, and a second shorter lateral surface 116 opposite to the first shorter lateral surface 115.

With the covering member 40 covering the surfaces defining the through-holes 113R, the contact area between the base member 11 and the covering member 40 can be increased. This allows for increasing the joining strength between the base member 11 and the covering member 40. The through-holes 113R has any appropriate shape in a top view. The through-holes 113R may have, for example, a circular shape, a triangular shape, a quadrangular shape, or the like in a top view.

It is preferable that the through-holes 113R are located substantially at the center of the base member 11 in the Y direction. With such a structure, even if an external force is applied to the covering member 40 at the first longer lateral surface 113 side or at the second longer lateral surface 114 side, detachment between the base member 11 and the covering member 40 can be easily prevented. The through-holes 113R may be formed by using a known method, for example, using laser light or a drill.

Figure 23:
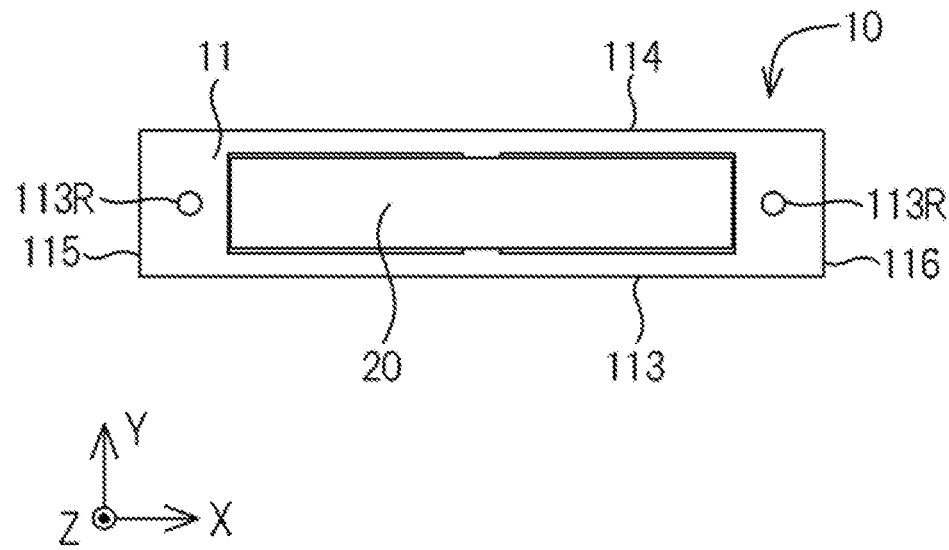
FIG. 23 is a schematic plan view of the substrate and a light-emitting element according to the third embodiment of the present disclosure.
Figure 24:
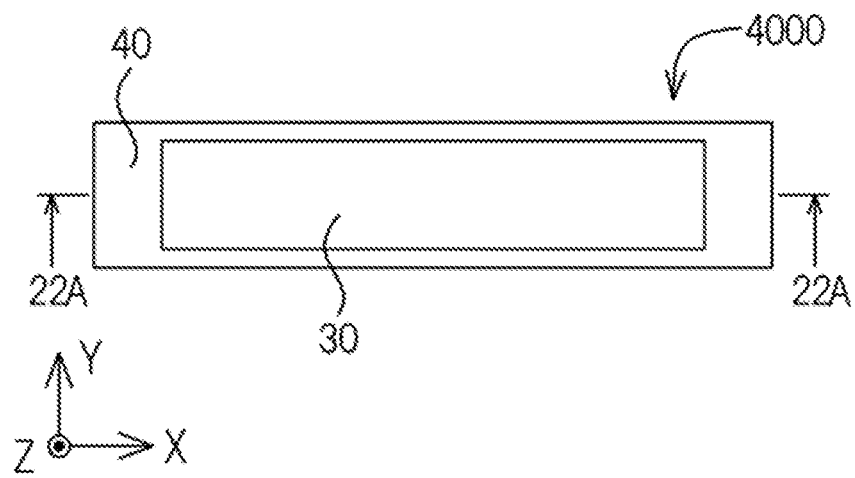
FIG. 24 is a schematic plan view of a light-emitting device substrate according to a fourth embodiment of the present disclosure.
Figure 25:
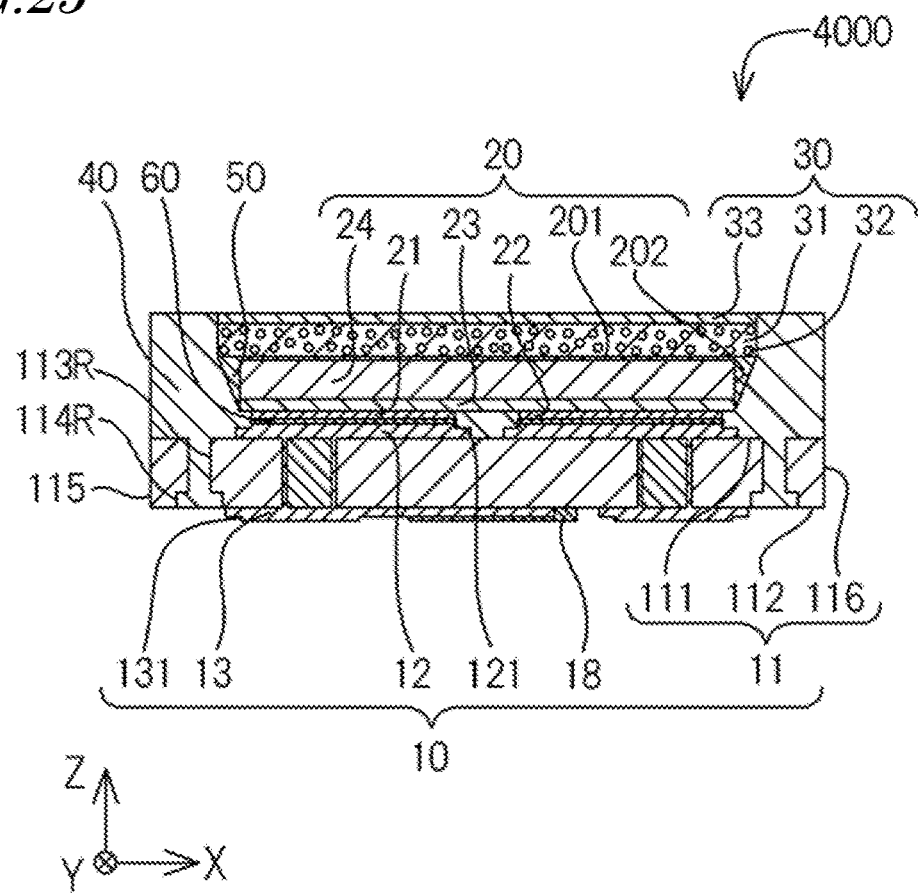
FIG. 25 is a schematic cross-sectional view taken along line 22A-22A in FIG. 24.
Figure 26:
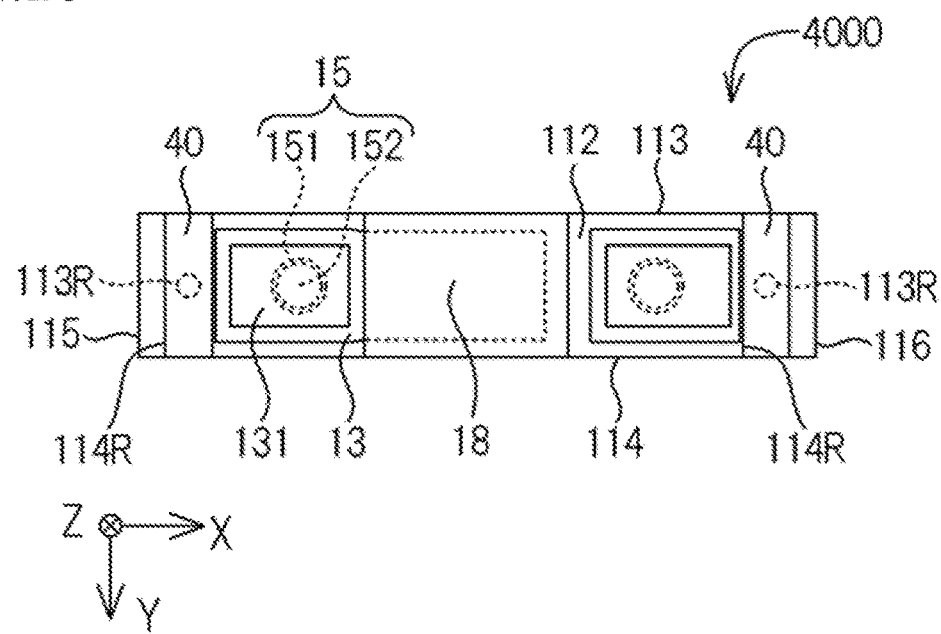
FIG. 26 is a schematic bottom view of the light-emitting device according to the fourth embodiment of the present disclosure.
Figure 27:
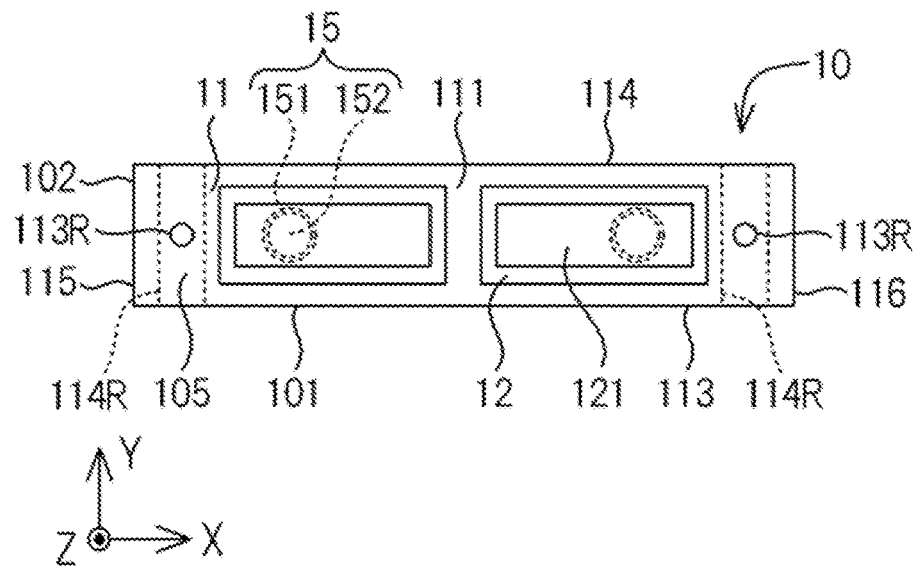
FIG. 27 is a schematic plan view of a substrate according to the fourth embodiment of the present disclosure.
Figure 28:
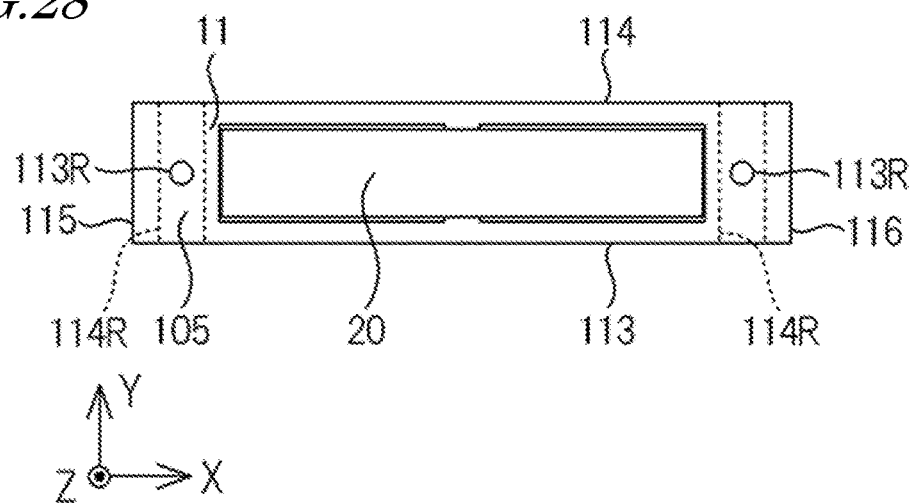
FIG. 28 is a schematic plan view of the substrate and a light-emitting element according to the fourth embodiment of the present disclosure.
Figure 29:
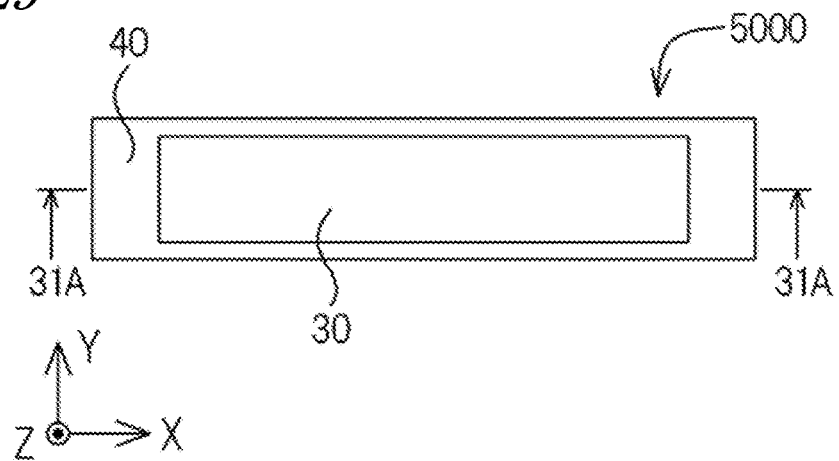
FIG. 29 is a schematic plan view of a light-emitting device according to a fifth embodiment of the present disclosure.
Figure 30:
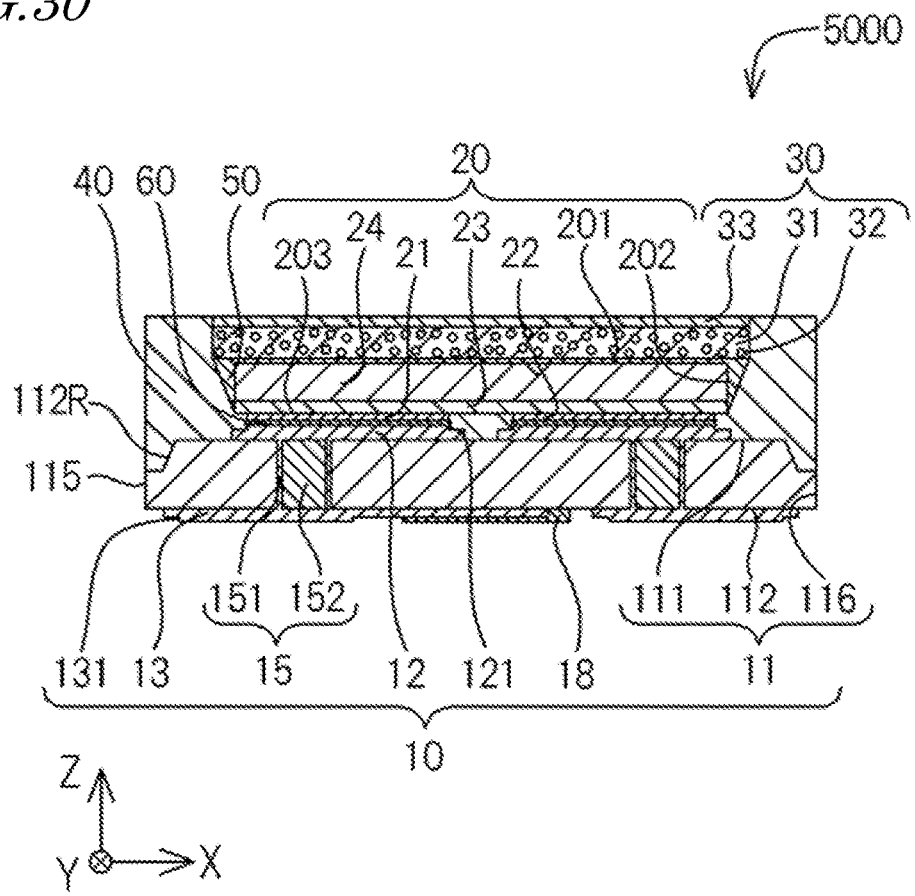
FIG. 30 is a schematic cross-sectional view taken along line 31A-31A in FIG. 29.
Figure 31:
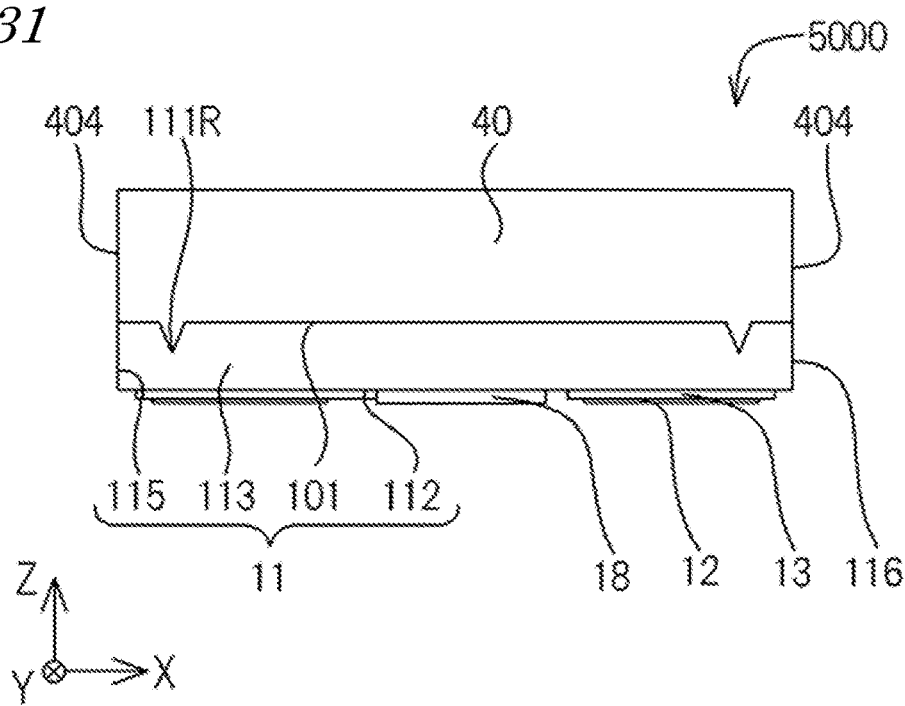
FIG. 31 is a schematic side view of the light-emitting device according to the fifth embodiment of the present disclosure as seen from a first longer lateral surface.
Figure 32:
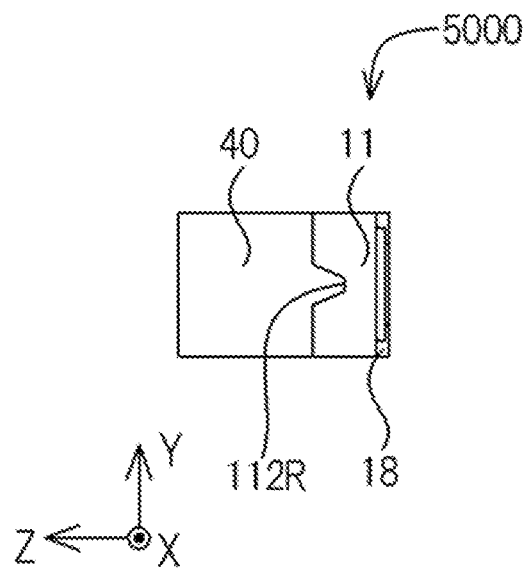
FIG. 32 is a schematic side view of the light-emitting device according to the fifth embodiment of the present disclosure as seen from a second shorter lateral surface.
Figure 33:
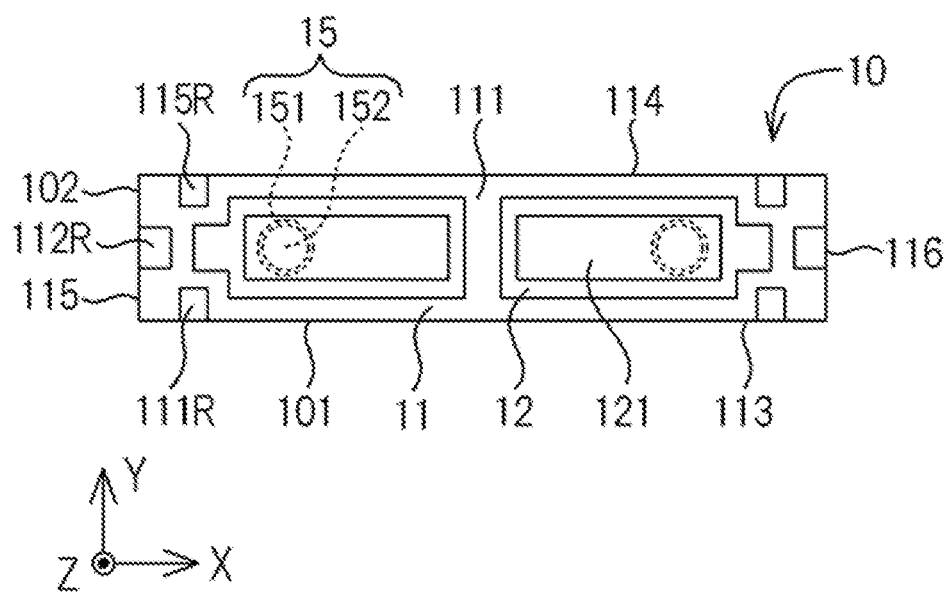
FIG. 33 is a schematic plan view of a substrate according to the fifth embodiment of the present disclosure.

As shown in FIG. 23, it is preferable that the through-holes 113R are spaced apart from the light-emitting element 20 in a top view. A portion of the base member 11 that corresponds to the through-holes 113R is easily deformed due to thermal expansion or the like of the resin material used for the covering member 40. With the through-holes 113R spaced apart from the light-emitting element 20, the stress applied to the light-emitting element 20 by the deformation of the base member 11 can be decreased. It is preferable that the light-emitting element 20 is disposed between the plurality of through-holes 113R in a top view. With such a structure, the joining strength between the base member 11 and the covering member 40 can be increased at both sides of the light-emitting element 20 in the X direction.

In the case where the light-emitting device 3000 includes the plurality of light-emitting elements 20, the through-holes 113R may be located between the plurality of light-emitting elements 20. With such a structure, the joining strength between the covering member 40 located between the light-emitting elements 20 and the base member 11 is increased.

Fourth Embodiment

With reference to FIG. 24 through FIG. 28, a light-emitting device 4000 according to a fourth embodiment of the present invention will be described. The light-emitting device 4000 is substantially the same as the light-emitting device 3000 in the third embodiment except that the base member 11 includes a third recess (represented by reference numeral 114R in FIG. 25 and the like).

In the light-emitting device 4000, the base member 11 includes the third recess 114R open at the lower surface 112. The third recess 114R overlaps at least one of the through-holes 113R in a top view, and surfaces defining the third recess 114R is covered with the covering member 40. With such a structure, inner lateral surfaces defining the third recess 114R is in contact with the covering member 40, which allows for further increasing the joining strength between the base member 11 and the covering member 40. The third recess 114R may have any appropriate shape in a cross-sectional view. The third recess 114R may have, for example, a substantially quadrangular shape, a substantially V-shape, or the like.

It is preferable that the third recess 114R is larger than each of the through-holes 113R in a top view. With such a structure, the covering member 40 located in the third recess 114R can be larger than the covering member 40 located in each of the through-holes 113R in a top view. Therefore, the covering member 40 is not easily detached from the base member 11. This allows for increasing the joining strength between the base member 11 and the covering member 40.

It is preferable that the third recess 114R is spaced apart from the light-emitting element 20 in a top view. A portion of the base member 11 where the third recess 114R is defined (in the Z direction) has a reduced thickness or is open from the upper surface 111 to the lower surface 112, and therefore, is easily deformed due to thermal expansion or the like of the resin material used for the covering member 40. With the third recess 114R spaced apart from the light-emitting element 20, the stress applied to the light-emitting element 20 by the deformation of the base member 11 can be decreased.

The third recess 114R may be open at the first longer lateral surface 113 and/or the second longer lateral surface 114. With such a structure, the contact area between the base member 11 and the covering member 40 can be further increased, which allows for increasing the joining strength between the base member 11 and the covering member 40. The third recess 114R may be open at the first shorter lateral surface 115 and the second shorter lateral surface 116.

It is preferable that the third recess 114R extends in a direction substantially parallel to the shorter side 102 of the upper surface 111. With such a structure, the third recess 114R is easily formed by laser light or the like in a collective substrate in which portions to be a plurality of the substrates are arranged in a matrix.

Fifth Embodiment

With reference to FIG. 29 through FIG. 33, a light-emitting device 5000 in a fifth embodiment according to the present disclosure will be described. The light-emitting device 5000 is substantially the same as the light-emitting device 1000 in the first embodiment except that the base member 11 includes the second recess 112R and the fourth recess 115R.

With the base member 11 including the first recess 111R, the second recess 112R and the fourth recess 115R, the contact area between the base member 11 and the covering member 40 can be further increased, which allows for further increasing the joining strength between the base member 11 and the covering member 40.

The base member 11 of the light-emitting device 5000 may include a plurality of the first recesses 111R, a plurality of the second recesses 112R, a plurality of the third recesses 114R, a plurality of the fourth recesses 115R and/or a plurality of through-holes 113R. With such a structure, the joining strength between the base member 11 and the covering member 40 is increased.

Figure 34A:
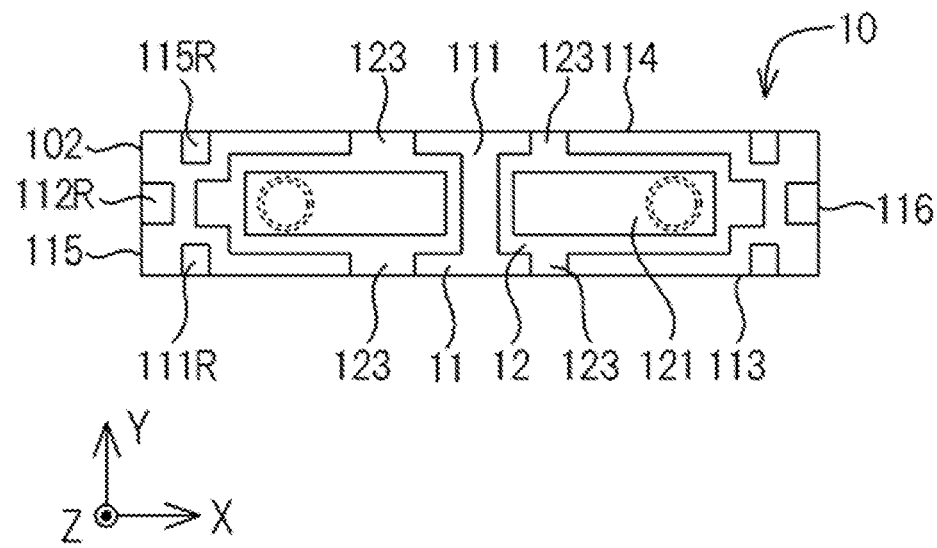
FIG. 34A is a schematic plan view of a substrate according to a modified example of the fifth embodiment of the present disclosure.
Figure 34B:
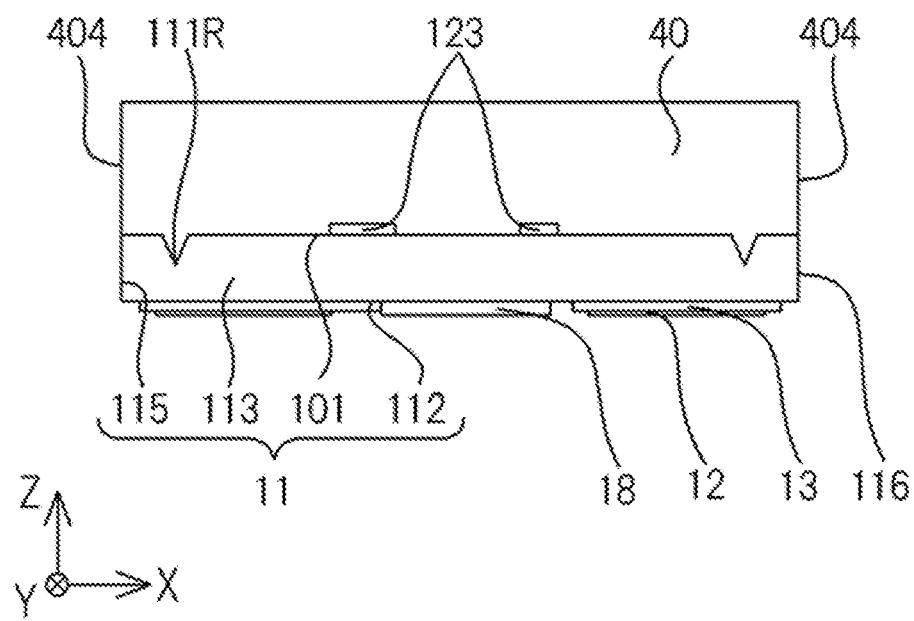
FIG. 34B is a schematic side view of a light-emitting device according to the modified example of the fifth embodiment of the present disclosure as seen from a first longer lateral surface.

As shown in FIG. 34A, each of the first wirings 12 may include the wiring extending portion 123 extending to the first longer lateral surface 113 and/or the second longer lateral surface 114. In the case where each of the first wirings 12 includes the wiring extending portion 123 extending to the first longer lateral surface 113 and/or the second longer lateral surface 114, it is preferable that, as shown in FIG. 34B, a part of the wiring extending portion 123 that is exposed from the covering member 40 is asymmetrical with respect to the center line of the exposed part of the wiring extending portion 123 in the X direction of the substrate 10 as seen from the first longer lateral surface 113 and/or the second longer lateral surface 114. With such a structure, the polarity of the light-emitting device 5000 is recognized with reference to, for example, the position and/or the size of the part of the wiring extending portion 123 exposed from the covering member 40.

Hereinafter, components of a light-emitting device according to certain embodiments of the present invention will be described.

Substrate 10

The substrate 10 is a member on which the light-emitting element 20 is placed. The substrate 10 includes the base member 11, the first wirings 12 and the second wirings 13. The substrate 10 may further include the via 15 electrically connecting each of the first wirings 12 and a respective one of the second wirings 13 to each other.

Base Member 11

For the base member 11, an insulating material such as a resin, a fiber-reinforced resin, a ceramic material, glass, or the like may be used. Examples of the resin and the fiber-reinforced resin include epoxy, glass epoxy, bismaleimidetriazine (BT), polyimide, and the like. Examples of the ceramic material include aluminum oxide, aluminum nitride, zirconium oxide, zirconium nitride, titanium oxide, titanium nitride, a mixture thereof, and the like. In particular, among these materials, a material having a coefficient of linear thermal expansion close to that of the light-emitting element 20 is preferably used for the base member 11. The base member 11 may have any appropriate thickness.

In view of the strength of the base member 11, a thickness of the base member 11 is preferably 0.05 mm or greater, and more preferably 0.1 mm or greater. In view of a thickness of the light-emitting device, a thickness of the base member 11 is preferably 0.5 mm or less, and more preferably 0.4 mm or less.

First Wiring 12, Second Wiring 13

The first wirings 12 are disposed on the upper surface 111 of the base member 11 and is electrically connected with the light-emitting element 20. The second wirings 13 are disposed on the lower surface 112 of the base member 11 and are electrically connected with the first wirings 12. For the first wirings 12 and the second wirings 13, copper, iron, nickel, tungsten, chromium, aluminum, silver, gold, titanium palladium, rhodium or an alloy of two or more of these may be used. The first wirings 12 and the second wirings 13 may include a single layer or a plurality of layers. In particular, in view of heat dissipating performance, it is preferable to use copper or a copper alloy. The first wirings 12 and/or the second wirings 13 may be covered with a layer of silver, platinum, aluminum, rhodium, gold or an alloy of two or more of these in view of, for example, the wettability on the conductive adhesive member 60 and/or the light reflectance.

Via 15

The via 15 is provided in each of the through-holes extending between the upper surface 111 and the lower surface 112, and electrically connects each of the first wirings 12 and a respective one of the second wirings 13 to each other. Each of the vias 15 includes the third wiring 151 covering the surface defining the through-hole extending through the base member 11 and the filling member 152 disposed on the third wiring 151 to fill the through-hole. For the third wiring 151, a material similar to that of the first wirings 12 and the second wirings 13 can be used. For the filling member 152, a conductive material or an insulating material may be used.

Insulating Film 18

The insulating film 18 is disposed to ensure electrical insulation at a lower surface of the light-emitting device and to prevent short-circuit of the light-emitting device. The insulating film 18 may be made of any material that is used in the field. The insulating film 18 may be made of, for example, a thermosetting resin, a thermoplastic resin, or the like.

Light Emitting Element 20

The light-emitting element 20 is a semiconductor element configured to emit light when a voltage is applied, and a known semiconductor element for which a nitride semiconductor or the like is used can be employed. For the light-emitting element 20, for example, an LED chip is used. The light-emitting element 20 includes the semiconductor stack body 23, and in many cases, further includes the element substrate 24. It is preferable that the light-emitting element 20 has, in a top view, a quadrangular shape, in particular, a square shape or a rectangular shape elongated in one direction. The light-emitting element 20 may have another shape in a top view, such as a hexagonal shape. With the light-emitting element 20 having a hexagonal shape in a top view, the light emission efficiency can be improved. The lateral surfaces of the light-emitting element 20 may be perpendicular to an upper surface thereof, or may be inclined inward or outward.

The light-emitting element 20 includes the positive and negative electrodes 21 and 22. The positive and negative electrodes 21 and 22 may be made of gold, silver, tin, platinum, rhodium, titanium, aluminum, tungsten, palladium, nickel or an alloy of two or more of these. A peak emission wavelength of the light-emitting element 20 may be in a range of an ultraviolet region to an infrared region in accordance with the type of the semiconductor material or the mixing ratio thereof. The peak emission wavelength of the light-emitting element 20 is preferably in a range of 400 nm to 530 nm, more preferably in a range of 420 nm to 490 nm, and still more preferably in a range of 450 nm to 475 nm, in view of the light emission efficiency, excitation of the wavelength conversion substance 32, and mixture of a color of excitation light and a color of the emitted light, and the like. It is preferable that the semiconductor material is a nitride semiconductor, which is adapted to emit light having a short wavelength that excites the wavelength conversion substance 32 efficiently. The nitride semiconductor is mainly represented by general formula $In_x$-$Al_yGa_{1-x-y}N$ ($0 \leq x$, $0 \leq y$, $x \leq y \leq 1$). Other examples of the semiconductor material include an InAlGaAs-based semiconductor, an InAlGaP-based semiconductor, zinc sulfide, zinc selenide, and silicon carbide.

For the element substrate 24 of the light-emitting element 20, a crystal growth substrate, on which the crystal of the semiconductor material included in the semiconductor stack body 23 can grow, can be mainly used. Alternatively, the element substrate 24 of the light-emitting element 20 may be a joining substrate, which is to be joined to a semiconductor element structure from which the crystal growth substrate is separated. With the element substrate 24 that is light-transmissive, it is easy to employ flip-chip mounting, and it is easy to improve the light extraction efficiency. Examples of a base material of the element substrate 24 include sapphire, gallium nitride, aluminum nitride, silicon, silicon carbide, gallium arsenide, gallium phosphide, indium phosphide, zinc sulfide, zinc oxide, zinc selenide, and diamond. Among these materials, sapphire is preferably used. The element substrate 24 may have any appropriate thickness, and is in a range of, for example, 0.02 mm to 1 mm. It is preferable that a thickness of the element substrate 24 is in a range of 0.05 mm to 0.3 mm in view of the strength of the element substrate 24 and/or the thickness of the light-emitting device.

Light-Transmissive Member 30

The light-transmissive member 30 is disposed on the light-emitting element 20, and protects the light-emitting element 20. For the light-transmissive member 30, at least a base material as described below is used. The light-transmissive member 30 may contain the wavelength conversion substance 32 as described below in the base material, and therefore, serves as a wavelength conversion member. Even in the case where the light-transmissive member 30 includes a layer containing the wavelength conversion substance 32 and a layer containing substantially no wavelength conversion substance 32, the base material of each of the layers has the structure as described below. The layers the light-transmissive member 30 may contain the same base material or different base materials. The light-transmissive member 30 does not necessarily contain the wavelength conversion substance 32. For the light-transmissive member 30, a sintered body of the wavelength conversion substance 32 and, for example, an inorganic material such as alumina or the like, or a plate-like crystal of the wavelength conversion substance 32 may be used.

Base Material 31 of the Light-Transmissive Member 30

The base member 31 of the light-transmissive member 30 is transmissive of light emitted by the light-emitting element 20. The expression "transmissive of light" indicates that the light transmittance with respect to the peak emission wavelength of light emitted from the light-emitting element 20 is preferably 60% or higher, more preferably 70% or higher, and still more preferably 80% or higher. For the base member 31 of the light-transmissive member 30, a silicone resin, an epoxy resin, a phenol resin, a polycarbonate resin, an acrylic resin, or a modified resin thereof. The base member 31 may be glass. Among these materials, a silicone resin and a modified silicone resin have a high heat resistance and light resistance, and thus are preferable. Specific examples of the silicone resin include a dimethyl silicone resin, a phenyl-methyl silicone resin, and a diphenyl silicone resin. The light-transmissive member 30 may be formed of a single layer of any of these materials of the base member 31, or may be formed of two or more layers each formed of any of these materials of the base member 31. In this specification, the term "modified resin" includes a hybrid resin.

The base member 31 of the light-transmissive member 30 may contain a filler in a resin or a glass as described above. For the filler, silicon oxide, aluminum oxide, zirconium oxide, zinc oxide or the like can be used. The filler may be made of a single material or a combination of two or more materials among the materials as described above. In particular, silicon oxide, which has a small coefficient of thermal expansion, is preferably used. Using the filler that are nanoparticles allows for increasing scattering of the light emitted by the light-emitting element 20, and thus the amount of use of the wavelength conversion substance 32 can be decreased. The term "nanoparticles" refers to particles having a particle diameter in a range of 1 nm to 100 nm. In this specification, the "particle diameter" is a value of, for example, $D_{50}$.

Wavelength Conversion Substance 32

The wavelength conversion substance 32 is adapted to absorb at least a part of the primary light emitted by the light-emitting element 20 and to emit secondary light having a wavelength different from that of the primary light. For the wavelength conversion substance 32, a single material may be used, or a combination of two or more materials among the materials as described above may be used.

Examples of wavelength conversion substance emitting green light include a yttrium-aluminum-garnet-based phosphor (e.g., $Y_3(Al, Ga)_5O_{12}$: Ce), a ruthenium-aluminum-garnet-based phosphor (e.g., $Lu_3(Al, Ga)_5O_{12}$: Ce), a terbium-aluminum-garnet-based phosphor (e.g., $Tb_3(Al, Ga)_5O_{12}$: Ce), a silicate-based phosphor (e.g., $(Ba, Sr)_2SiO_4$: Eu), a chlorosilicate-based phosphor (e.g., $Ca_8Mg(SiO_4)_4Cl_2$: Eu), a β-sialon-based phosphor (e.g., $Si_{6-z}Al_zO_zN_{8-z}$: Eu ($0<z<4.2$)), an SGS-based phosphor (e.g., $SrGa_2S_4$: Eu), and the like. Examples of wavelength conversion substance emitting yellow light include an α-sialon-based phosphor (e.g., $M_z(Si, Al)_{12}(O, N)_{16}$ ($0 \leq z \leq 2$; M is Li, Mg, Ca, Y, or a lanthanide element excluding La and Ce), and the like. The wavelength conversion substances emitting green light as described above include a wavelength conversion substance emitting yellow light. For example, in the yttrium-aluminum-garnet-based phosphor, replacing a part of Y with Gd allows for shifting the peak emission wavelength toward the longer-wavelength side, so that yellow light can be emitted. The wavelength conversion substances emitting yellow light as described above include a wavelength conversion substance emitting orange light. Examples of wavelength conversion substance emitting red light include a nitrogen-containing calcium aluminosilicate (CASN or SCASN)-based phosphor (e.g., (Sr, Ca)AlSiN$_3$: Eu), a manganese-activated fluoride-based phosphor (phosphor represented by general formula (I) $A_2[M_{1-a}Mn_aF_6]$, where A is at least one selected from the group consisting of K, Li, Na, Rb, Cs and NH$_4$, M is at least one element selected from the group consisting of the group IV elements and the group XIV elements, and "a" satisfies 0<a<0.2), and the like. A representative example of the manganese-activated fluoride-based phosphor is a phosphor of manganese-activated potassium fluorosilicate (e.g., $K_2SiF_6$: Mn).

Covering Member 40

It is preferable that the light-reflective covering member 40 has a light reflectance, with respect to the peak emission wavelength of the light-emitting element 20, of preferably 70% or higher, more preferably 80% or higher, and still more preferably 90% or higher, in view of the light extraction efficiency in an upward direction. It is preferable that the covering member 40 is white. Therefore, it is preferable that, in the covering member 40, a white pigment is contained in a base material. The covering member 40 is in a liquid state before being cured. The covering member 40 may be formed by transfer molding, injection molding, compression molding, potting or the like.

Base Material of the Covering Member 40

The base material of the covering member 40 may be a resin, for example, a silicone resin, an epoxy resin, a phenol resin, a polycarbonate resin, an acrylic resin, or a modified resin thereof. Among these materials, a silicone resin and a modified silicone resin have high heat resistance and light resistance and thus are preferable. Specific examples of the silicone resin include a dimethyl silicone resin, a phenyl-methyl silicone resin, and a diphenyl silicone resin. The base material of the covering member 40 may contain a filler similar to that of the light-transmissive member 30 described above.

White Pigment

For the white pigment, one or a combination of two or more of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide and silicon oxide, can be used. The white pigment may have any appropriate shape. The shape of the white pigment may be amorphous or crushed. It is preferable that the shape of the white pigment is spherical in view of the fluidity. The white pigment may have a particle diameter of, for example, about 0.1 μm to 0.5 μm.

The smaller a particle diameter of the white pigment is, the more preferable in order to improve the effect of light reflection and covering.

Any appropriate content of the white pigment may be contained in the light-reflective covering member 40, and is, for example, preferably 10 wt. % to 80 wt. %, more preferably 20 wt. % to 70 wt. %, and still more preferably 30 wt. % to 60 wt. %, in view of the light reflectance, the viscosity in the liquid state and the like. "wt. %" represents "percent by weight", which is a ratio of the weight of a corresponding material with respect to the total weight of the light-reflective covering member 40.

Light Guide Member 50

The light guide member 50 bonds the light-emitting element 20 and the light-transmissive member 30 to each other, and transmits the light from the light-emitting element 20 to the light-transmissive member 30. Examples of a base material of the light guide member 50 include silicone resin, epoxy resin, phenol resin, polycarbonate resin, acrylic resin, or a modified resin thereof. Among these materials, silicone resin and modified silicone resin have high heat resistance and light resistance and thus are preferable. Specific examples of the silicone resin include dimethyl silicone resin, phenyl-methyl silicone resin, and diphenyl silicone resin. The base material of the light guide member 50 may contain a filler similar to that of the filler contained in the light-transmissive member 30 described above. The light guide member 50 may be omitted.

Conductive Adhesive Member 60

Each of the conductive adhesive members 60 electrically connects a respective one of the positive and negative electrodes 21 and 22 of the light-emitting element 20 and a respective one of the first wirings 12 to each other. For the conductive adhesive members 60, any one of: a bump made of gold, silver, copper or the like; a metal paste containing metal powder of silver, gold, copper, platinum, aluminum, palladium or the like and a resin binder; solder such as tin-bismuth-based solder, tin-copper-based solder, tin-silver-based solder, or gold-tin-based solder; and a brazing material such as a low melting-point metal material; and the like.

A light-emitting device according to certain embodiment of the present invention is usable for backlight devices of liquid crystal display devices; various illumination devices; large-scale displays; various display devices for advertisements such as destination guides; projector devices; image reading devices for digital video cameras, facsimiles, copiers, scanners and the like; etc.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light-emitting device, comprising:
    a substrate including:
        a base member having:
            an upper surface having a rectangular shape,
            a lower surface opposite to the upper surface,
            a first lateral surface adjacent to the upper surface and perpendicular to the upper surface,
            a second lateral surface opposite to the first lateral surface,
            a first end surface adjacent to the upper surface and perpendicular to the upper surface, and
            a second end surface opposite to the first end surface,
        first wirings disposed on the upper surface, and
        second wirings disposed on the lower surface and each electrically connected with a respective one of the first wirings;
    at least one light-emitting element electrically connected with the first wirings and disposed on the first wirings; and a light-reflective covering member covering lateral surfaces of the light-emitting element and the upper surface of the base member;
wherein:
the base member has at least one first recess, the at least one first recess being open at the upper surface and the first lateral surface and
at least a portion of the at least one first recess is covered with the covering member,
wherein the light-reflective covering member does not cover an upper surface of the at least one light-emitting element.

2. The light-emitting device of claim 1, wherein the at least one first recess is open at the second lateral surface.

3. The light-emitting device of claim 1, wherein the at least one first recess is open at the lower surface.

4. The light-emitting device of claim 1, wherein the at least one first recess is spaced apart from the light-emitting element in a top view.

5. The light-emitting device of claim 1, wherein the at least one first recess includes a plurality of the first recesses, and the light-emitting element is disposed between the plurality of the first recesses in a top view.

6. The light-emitting device of claim 1, wherein the at least one first recess extends in a direction parallel to the first and second end surfaces.

7. The light-emitting device of claim 1, wherein the covering member has a coefficient of linear thermal expansion higher than a coefficient of linear thermal expansion of the base member.

8. The light-emitting device of claim 1, further comprising a light-transmissive member disposed on the light-emitting element.

9. The light-emitting device of claim 8, wherein the covering member covers lateral surfaces of the light-transmissive member.

10. The light-emitting device of claim 1, wherein each of the first wirings includes a protrusion.

11. The light-emitting device of claim 1, wherein each of the second wirings includes a protrusion.

12. The light-emitting device of claim 1, wherein the covering member is in contact with the light-emitting element and is disposed between the light-emitting element and the substrate.

13. The light-emitting device of claim 11, wherein the covering member has a coefficient of linear thermal expansion higher than a coefficient of linear thermal expansion of the base member.

14. The light-emitting device of claim 11, further comprising a light-transmissive member disposed on the light-emitting element.

15. The light-emitting device of claim 14, wherein the covering member covers lateral surfaces of the light-transmissive member.

16. The light-emitting device of claim 11, wherein each of the first wirings includes a protrusion.

17. The light-emitting device of claim 11, wherein the covering member is in contact with the light-emitting element and is disposed between the light-emitting element and the substrate.

18. A light-emitting device, comprising:
a substrate including:
a base member having:
an upper surface having a rectangular shape,
a lower surface opposite to the upper surface,
a first lateral surface adjacent to the upper surface and perpendicular to the upper surface,
a second lateral surface opposite to the first lateral surface,
a first end surface adjacent to the upper surface and perpendicular to the upper surface, and
a second end surface opposite to the first end surface,
first wirings disposed on the upper surface, and
second wirings disposed on the lower surface and each electrically connected with a respective one of the first wirings;
at least one light-emitting element electrically connected with the first wirings and disposed on the first wirings; and
a light-reflective covering member covering lateral surfaces of the light-emitting element and the upper surface of the base member;
wherein:
the base member has at least one first recess, the at least one first recess being open at the upper surface and the first lateral surface,
at least a portion of the at least one first recess is covered with the covering member, and
wherein the at least one light-emitting element is disposed over, and spaced apart from, the base member.

19. The light-emitting device of claim 1, wherein the base member includes at least one via extending through at least a portion of the base member, and
wherein at least a portion of the light-reflective covering member is positioned within at least a portion of the at least one recess.

20. The light-emitting device of claim 18, wherein the at least a portion of the light-reflective covering member is positioned within the at least one first recess below the upper surface.

* * * * *